US012803560B2

(12) United States Patent
Park et al.

(10) Patent No.: US 12,803,560 B2
(45) Date of Patent: Nov. 17, 2026

(54) CLOCK SIGNAL DISTRIBUTION CIRCUIT AND METHOD OF OPERATING THE SAME

(71) Applicant: SAMSUNG ELECTRONICS CO., LTD., Suwon-si (KR)

(72) Inventors: Jaehyun Park, Suwon-si (KR); Youngtae Yang, Suwon-si (KR); Hwanseok Yeo, Suwon-si (KR); Insik Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 19/046,999

(22) Filed: Feb. 6, 2025

(65) Prior Publication Data

US 2025/0317148 A1 Oct. 9, 2025

(30) Foreign Application Priority Data

Apr. 8, 2024 (KR) ........................ 10-2024-0047556
Jun. 5, 2024 (KR) ........................ 10-2024-0073930

(51) Int. Cl.
*H03L 7/081* (2006.01)
*G06F 1/10* (2006.01)
(Continued)

(52) U.S. Cl.
CPC .............. *H03L 7/0814* (2013.01); *G06F 1/10* (2013.01); *H03K 5/135* (2013.01); *H03K 19/0005* (2013.01)

(58) Field of Classification Search
CPC ......... H03L 7/0814; G06F 1/10; H03K 5/135; H03K 19/0005; H03K 19/00361; H03K 5/156; H03K 5/15
See application file for complete search history.

(56) References Cited

U.S. PATENT DOCUMENTS 6,794,907 B2 9/2004 Choi
7,847,591 B2 12/2010 Yu et al.
(Continued)

FOREIGN PATENT DOCUMENTS

EP 3 408 938 B1 7/2019
KR 10 0912968 B1 8/2009
(Continued)

OTHER PUBLICATIONS

Song et al, "An 8-16 GB/s,0.65-1.05 pJ/b, Voltage-Mode Transmitter With Analog Impedance Modulation Equalization and Sub-3 ns Power-State Transitioning", IEEE Journal of Solid-State Circuits, IEEE, USA, vol. 49, No. 11, Nov. 1, 2014, pp. 2631-2643, XP011562677.

(Continued)

*Primary Examiner* — David S Huang
(74) *Attorney, Agent, or Firm* — Sughrue Mion, PLLC

(57) ABSTRACT

A clock signal distribution circuit includes an n-type metal-oxide semiconductor (NMOS)-based regulator configured to receive a first voltage and output a regulator voltage having a lower voltage level than the first voltage through a regulator voltage output node, and an NMOS-based driver including a first sub-driver configured to include first to fourth NMOS transistors and receive first and second clock signals and output first and second low swing clock signals.

20 Claims, 21 Drawing Sheets

(51) Int. Cl.
*H03K 5/135* (2006.01)
*H03K 19/00* (2006.01)

(56) References Cited

U.S. PATENT DOCUMENTS

| | | | | |
|---|---|---|---|---|
| 7,952,388 | B1 | 5/2011 | Song et al. | |
| 8,000,166 | B2 | 8/2011 | Kim et al. | |
| 8,040,175 | B2 * | 10/2011 | Raghavan | H02M 3/073 363/60 |
| 9,225,332 | B1 | 12/2015 | Zhang et al. | |
| 9,338,036 | B2 | 5/2016 | Poulton et al. | |
| 2009/0140795 | A1 * | 6/2009 | Choy | H02M 3/073 327/536 |
| 2020/0213075 | A1 | 7/2020 | Tajalli | |
| 2020/0356516 | A1 | 11/2020 | Hsueh et al. | |

FOREIGN PATENT DOCUMENTS

| | | | |
|---|---|---|---|
| KR | 10 1024242 | B1 | 3/2011 |
| KR | 10 2480358 | B1 | 12/2022 |

OTHER PUBLICATIONS

Communication dated Jul. 30, 2025, issued by the European Patent Office in counterpart European Application No. 25158341.5.

Marc Erett et al, "A 0.5-16.3 Gbps Multi-Standard Serial Transceiver With 219 mW/Channel in 16-nm FinFET," IEEE Journal of Solid-State Circuits, vol. 52, No. 7, Jul. 2017, pp. 1783-1797 (16 pages total).

Namik Kocaman et al., "An 182mW 1-60Gb/s Configurable PAM-4/NRZ Transceiver for Large Scale ASIC Integration in 7nm FinFET Technology," 2022 IEEE International Solid-State Circuits Conference, Mar. 2022, pp. 120-122 (4 pages total).

* cited by examiner

CLOCK SIGNAL DISTRIBUTION CIRCUIT AND METHOD OF OPERATING THE SAME

CROSS-REFERENCE TO RELATED APPLICATIONS

This application is based on and claims priority under 35 U.S.C. § 119 to Korean Patent Application No. 10-2024-0047556, filed on Apr. 8, 2024, in the Korean Intellectual Property Office, and Korean Patent Application No. 10-2024-0073930, filed on Jun. 5, 2024, in the Korean Intellectual Property Office, the disclosures of which are incorporated by reference herein in their entireties.

BACKGROUND

The present disclosure relates to a clock signal control circuit and an operating method thereof. More particularly, the inventive concept relates to a circuit for controlling a clock signal input to a phase interpolator and an operating method thereof.

Despite the improvement in the speed and data transmission rate of peripheral devices such as memories, communication devices, or graphic devices, the operating speed of peripheral devices has not been able to keep up with the operating speed of processors, and there is a speed difference between new processors and peripheral devices. Therefore, a significant speed improvement of peripheral devices is required in high-performance digital systems. For example, in an input/output method that transmits data in synchronization with a clock signal, such as data transmission between a memory device and a memory controller, it is very important to achieve temporal synchronization between the clock signal and data as the bus load increases and the transmission frequency increases. Circuits that may be used for this purpose include a phase locked loop (PLL) circuit, a delay locked loop (DLL) circuit, etc. Such PLL circuits and DLL circuits are generally equipped with a phase interpolator. A phase interpolator is a circuit that generates a delay clock signal between two selected delay clock signals by appropriately controlling two different phase-selected delay clock signals. The phase interpolator may precisely output a desired phase and is thus used in various application circuits.

If a common mode level of the clock signals input to the current mode logic (CML)-based phase interpolator is inappropriate, nonlinearity may occur in the output of the CML-based phase interpolator, and the jitter of a system may increase. Accordingly, a method of controlling the common mode level of the clock signals input to the CML-based phase interpolator is required.

SUMMARY

One or more embodiments provide a circuit for improving the linearity, reliability, and accuracy of a phase interpolator and controlling a clock signal to reduce power consumption and an operating method thereof.

According to an aspect of an example embodiment, a clock signal distribution circuit includes: an n-type metal-oxide semiconductor (NMOS)-based regulator configured to output a regulator voltage to a regulator voltage output node based on a first voltage, wherein the regulator voltage is lower than the first voltage; and an NMOS-based driver including a first sub-driver, wherein the first sub-driver includes first to fourth NMOS transistors, and is configured to receive first and second clock signals, and output first and second low swing clock signals. The first NMOS transistor is connected between the regulator voltage output node and a first output node, the second NMOS transistor is connected between the first output node and a ground node, a first clock signal is input to a gate terminal of the first NMOS transistor, a second clock signal is input to a gate terminal of the second NMOS transistor, and the first low swing clock signal is output through the first output node. The third NMOS transistor is connected between the regulator voltage output node and a second output node, the fourth NMOS transistor is connected between the second output node and the ground node, the second clock signal is input to a gate terminal of the third NMOS transistor, the first clock signal is input to a gate terminal of the fourth NMOS transistor, and the second low swing clock signal is output through the second output node. The NMOS-based regulator includes a fifth NMOS transistor as a pass transistor.

According to another aspect of an example embodiment, an electronic device includes: a clock signal distribution circuit including an n-type metal-oxide semiconductor (NMOS)-based regulator and an NMOS-based driver, wherein the NMOS-based regulator is configured to output a regulator voltage to a regulator voltage output node based on a first voltage, the regulator voltage is lower than the first voltage, and the NMOS-based driver includes first to fourth NMOS transistors and a sub-driver configured to receive first and second clock signals and output first and second low swing clock signals; and a phase interpolator configured to receive the first low swing clock signal and the second low swing clock signal through a p-type metal-oxide semiconductor (PMOS)-based input buffer. The first NMOS transistor is connected between the regulator voltage output node and a first output node, the second NMOS transistor is connected between the first output node and a ground node, a first clock signal is input to a gate terminal of the first NMOS transistor, a second clock signal is input to a gate terminal of the second NMOS transistor, and the first low swing clock signal is output through the first output node. The third NMOS transistor is connected between the regulator voltage output node and a second output node, the fourth NMOS transistor is connected between the second output node and the ground node, the second clock signal is input to the gate terminal of the third NMOS transistor, the first clock signal is input to a gate terminal of the fourth NMOS transistor, and the second low swing clock signal is output through the second output node. The NMOS-based regulator includes a fifth NMOS transistor as a pass transistor.

According to another aspect of an example embodiment, a clock signal distribution circuit includes: a p-type metal-oxide semiconductor (PMOS)-based regulator configured to output a regulator voltage to a regulator voltage output node based on a first voltage, wherein the regulator voltage is lower than the first voltage; and a PMOS-based driver including a first sub-driver, wherein the first sub-driver includes first to fourth PMOS transistors, and is configured to receive first and second clock signals and output first and second low swing clock signals. The first PMOS transistor is connected between a supply voltage input node and a first output node, the second PMOS transistor is connected between the first output node and the regulator voltage output node, a first clock signal is input to a gate terminal of the first PMOS transistor, a second clock signal is input to a gate terminal of the second PMOS transistor, and the first low swing clock signal is output through the first output node. The third PMOS transistor is connected between the supply voltage input node and a second output node, the fourth PMOS transistor is connected between the second output node and the regulator voltage output node, the second clock signal is input to a gate terminal of the third PMOS transistor, the first clock signal is input to the gate terminal of the fourth PMOS transistor, and the second low swing clock signal is output through the second output node. The PMOS-based regulator includes a fifth PMOS transistor as a pass transistor.

BRIEF DESCRIPTION OF DRAWINGS

The above and other aspects and features of the present disclosure will be more clearly understood from the following description of example embodiments, taken in conjunction with the accompanying drawings, in which.

DETAILED DESCRIPTION

Figure 1:
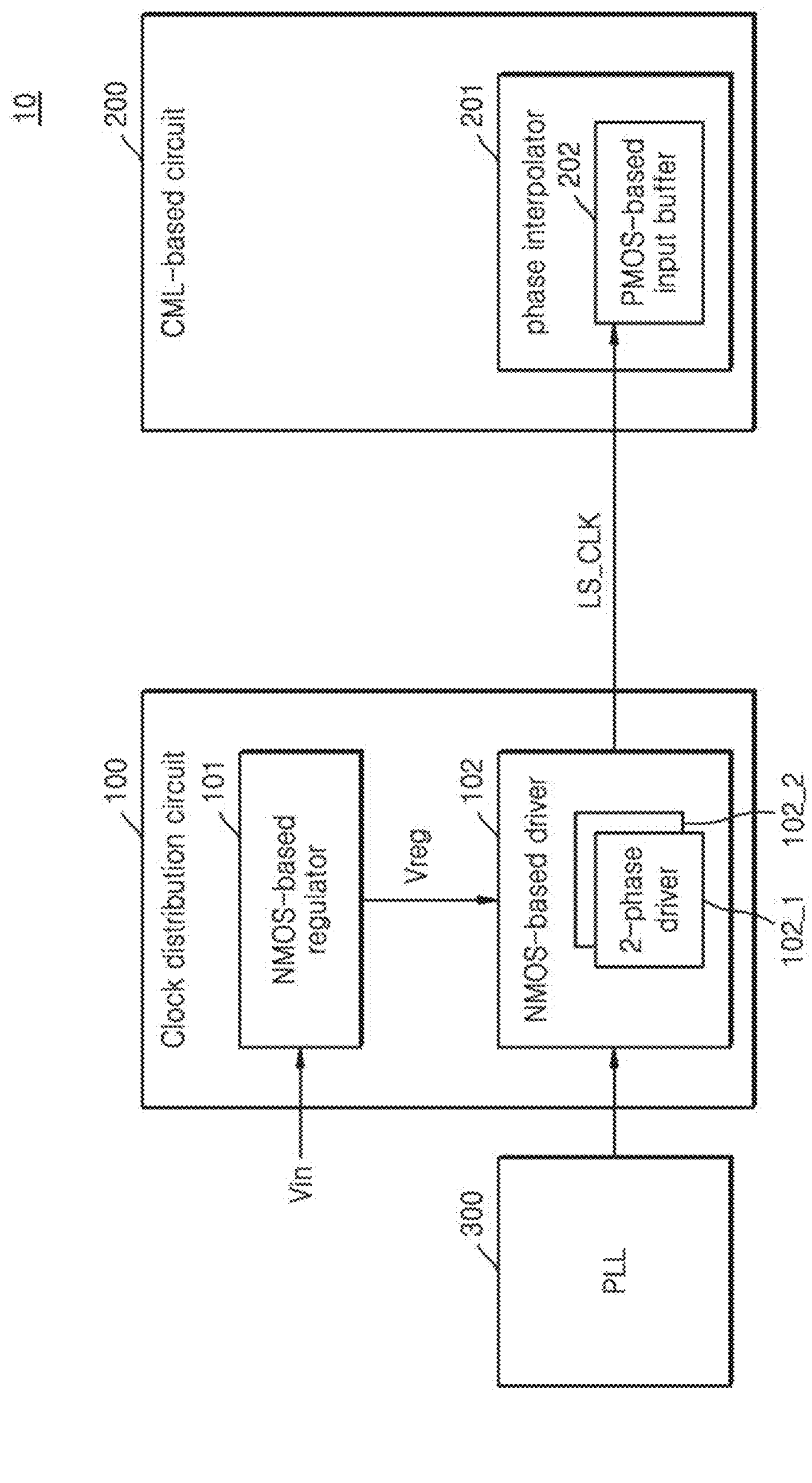
FIG. 1 is a block diagram of an electronic device according to an example embodiment.

Hereinafter, example embodiments are described in detail with reference to the accompanying drawings. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. Herein, like reference numerals refer to like elements.

FIG. 1 is a block diagram of an electronic device 10 according to an example embodiment.

Referring to FIG. 1, the electronic device 10 may include a clock signal distribution circuit 100, a current mode logic (CML)-based circuit 200, and a phase-locked loop (PLL) (i.e., PLL circuit) 300. The electronic device 10 may include a smartphone, a smart watch, a personal digital assistant, a digital video camera, a digital still camera, a network system, a computer, a monitor, a tablet, a laptop, a netbook, a television, a video game, an automobile, and the like. However, the electronic device 10 is not limited thereto and may be another electronic device that processes data.

The electronic device 10 may include the clock signal distribution circuit 100. The clock signal distribution circuit 100 may be included in the electronic device 10 and receive a complementary metal oxide semiconductor (CMOS) signal from an external device outside the clock signal distribution circuit 100. Alternatively, the clock signal distribution circuit 100 may receive a CMOS signal from a circuit outside the electronic device 10. For example, the clock signal distribution circuit 100 may receive a CMOS signal from a processor, and, for example, the processor may include a processing unit such as a central processing unit (CPU), a digital signal processor (DSP), a graphics processing unit (GPU), an encryption processing unit, a physics processing unit, a machine learning processing unit, etc.

The clock signal distribution circuit 100 according to an example embodiment may include an NMOS-based regulator 101 and an NMOS-based driver 102. That is, both the regulator and the driver of the clock signal distribution circuit 100 may be based on an NMOS. NMOS denotes an n-type Metal-Oxide-Semiconductor Field Effect Transistor (MOSFET). In addition, PMOS denotes a p-type MOSFET. The NMOS-based regulator 101 is a low drop out regulator (LDO) that includes only an n-type MOSFET and does not include a p-type MOSFET. The NMOS-based regulator 101 may receive an input voltage Vin from the outside and output a regulator voltage Vreg having a voltage level lower than the input voltage Vin.

The NMOS-based driver 102 according to an example embodiment may receive clock signals from the PLL 300. For example, the NMOS-based driver 102 may receive CMOS signals from the PLL 300 and transmit a CML signal to the CML-based circuit 200. The CMOS signal may be a signal that swings between a power supply voltage and a ground voltage, and the CML signal may be a signal that swings with a specific swing width based on a predetermined CML reference level (common mode level). The swing width may represent the difference between the voltage levels that a signal swings over. If a specific signal swings between a power supply voltage and a ground voltage, the swing width of that specific signal may be the difference between the power supply voltage and the ground voltage. The swing width of the CML signal may be smaller than that of the CMOS signal, and the CML signal may operate as a high-frequency clock signal capable of performing high-speed switching.

The NMOS-based driver 102 may include one or more 2-phase drivers 102_1 and 102_2. The 2-phase drivers 102_1 and 102_2 may include a driver for generating a low swing clock signal LS_CLK to be transmitted to a phase interpolator 201 and one or more CMOS inverters.

The NMOS-based driver 102 may receive clock signals CLK from the PLL 300. According to an example embodiment, the NMOS-based driver 102 configured to receive a 2-phase clock signal from the PLL 300 may include one 2-phase driver 102_1. According to an example embodiment, the NMOS-based driver 102 configured to receive a 4-phase clock signal from the PLL 300 may include two 2-phase drivers 102_1 and 102_2. The NMOS-based driver 102 may transmit a ground reference low swing clock signal LS_CLK to the phase interpolator 201 based on a regulator voltage Vreg and a 4-phase clock signal received from the PLL 300. The NMOS-based driver 102 may include a variety of 2-phase drivers 102_1 and is not limited thereto.

The NMOS-based driver 102 according to an example embodiment may transmit the low swing clock signal LS_CLK to the phase interpolator 201. Here, the phase interpolator 201 may receive the low swing clock signal LS_CLK through a PMOS-based input buffer 202 including a PMOS. According to an example embodiment, the phase interpolator 201 may include a PMOS-based input buffer 202. In another example embodiment, the PMOS-based input buffer 202 may be located outside the phase interpolator 201.

The CML-based circuit 200 may be a circuit that uses signals in a CML domain region. The CML-based circuit 200 may include the phase interpolator 201. The phase interpolator 201 may be a circuit that receives a plurality of clock signals and generates clock signals having various interpolated phases by performing a phase interpolation operation using the plurality of clock signals.

The NMOS-based driver 102 according to an example embodiment may transmit clock signals received from the PLL 300 to the phase interpolator 201 at a high speed.

The NMOS-based driver 102 according to an example embodiment may convert clock signals received from the PLL 300 into low swing clock signals LS_CLK.

The NMOS-based driver 102 according to an example embodiment may lower a common mode level of the PMOS-based input buffer 202 by converting clock signals received from the PLL 300 into low swing clock signals LS_CLK. Here, the PMOS-based input buffer 202 may not include an NMOS transistor but may include only a PMOS transistor. Accordingly, the PMOS-based input buffer 202 may operate at an optimal operating point.

A termination resistor may be located between the PMOS-based input buffer 202 and the NMOS-based driver 102 according to an example embodiment. Accordingly, the rising time and falling time of the high-speed clock signal transmitted by the NMOS-based driver 102 to the phase interpolator 201 may be insensitive to the process corner of a transistor. A terminal resistance value may be adjusted according to the speed of the clock signals transmitted by the NMOS-based driver 102 to the phase interpolator 201. Accordingly, power consumption may be reduced.

The NMOS-based driver 102 according to an example embodiment may be controlled so that a slope of the ground-based low clock swing signal is adjusted based on the data rate. Accordingly, an excessive filter removal of the PMOS-based input buffer 202 may be reduced or the linearity of the phase interpolator 201 may be improved.

The clock signal distribution circuit 100 according to an example embodiment may improve power supply noise induced jitter by using an NMOS-based regulator 101. In addition, power consumption may be reduced by operating a pass transistor of the NMOS-based regulator 101 in a VDD region instead of a VDDH region.

The clock signal distribution circuit 100 according to an example embodiment may include the NMOS-based regulator 101 configured to receive a first voltage and output a regulator voltage having a lower voltage level than the first voltage through a regulator voltage output node, and the NMOS-based driver 102 including a first sub-driver with first to fourth NMOS transistors may be configured to receive first and second clock signals and output first and second low swing clock signals.

The first sub-driver may correspond to the 2-phase driver 102_1. The first voltage may correspond to the input voltage Vin. The first NMOS transistor may be connected between an output node of the regulator voltage and the first output node, the second NMOS transistor may be connected between the first output node and a ground node. The first clock signal may be input to a gate terminal of the first NMOS transistor, the second clock signal may be input to the gate terminal of the second NMOS transistor, and the first low swing clock signal may be output through the first output node. The first output node may correspond to a first output node ON1 of FIGS. 3A and 3B. The third NMOS transistor may be connected between the output node of the regulator voltage and the second output node, the fourth NMOS transistor may be connected between the second output node and the ground node, the second clock signal may be input to the gate terminal of the third NMOS transistor. The first clock signal may be input to the gate terminal of the fourth NMOS transistor, and the second low swing clock signal may be output through the second output node. The second output node may correspond to a second output node ON2 of FIGS. 3A and 3B.

The NMOS-based regulator 101 may include a fifth NMOS transistor as a pass transistor. The first to fourth NMOS transistors may correspond to first to fourth transistors N1 to N4 of FIG. 3A. The fifth NMOS transistor may correspond to the first NMOS transistor NM1 of FIG. 2.

The NMOS-based driver 102 may receive a first clock signal and a second clock signal from the PLL 300. The first clock signal and the second clock signal may have a phase difference of 180 degrees. The first clock signal may correspond to a first input clock signal clkp_in of FIG. 3A, and the second clock signal may correspond to the second input clock signal clkn_in of FIG. 3A. The first low swing clock signal may correspond to a first output clock signal clkp_out of FIG. 3A. The second low swing clock signal may correspond to a second output clock signal clkn_out of FIG. 3A.

The NMOS-based driver 102 may include a first CMOS buffer and a second CMOS buffer. The first CMOS buffer may correspond to a CMOS buffer BF1 of FIG. 3A, and the second CMOS buffer may correspond to a CMOS buffer BF2 of FIG. 3A. The first CMOS buffer may be configured to receive a first clock signal from the PLL 300 and output the first clock signal to the gate terminals of the first NMOS transistor and the fourth NMOS transistor. The second CMOS buffer may be configured to receive a second clock signal from the PLL 300 and output the second clock signal to the gate terminals of the second NMOS transistor and the third NMOS transistor. That is, the second CMOS buffer may be configured so that the clock signal is input to the gate terminals of the second NMOS transistor and the third NMOS transistor.

An analog supply voltage VDDA may be provided to the first CMOS buffer and the second CMOS buffer. A first variable resistor may be connected between the first output node and a terminal node, and the second variable resistor may be connected between the second output node and the terminal node. The first variable resistor may correspond to a termination resistor TMR1 of FIG. 3B. The second variable resistor may correspond to a termination resistor TMR2 of FIG. 3B. The terminal node may correspond to a terminal node TN1 of FIG. 3B. A capacitor may be connected between the terminal node and the ground node.

According to an example embodiment, the first sub-driver may include at least one NMOS transistor array. The at least one NMOS transistor array may be connected to at least one of a drain terminal of the first NMOS transistor and an output node of the regulator voltage, a source terminal of the second NMOS transistor and the ground node, a drain terminal of the third NMOS transistor and an output node of the regulator voltage, and a source terminal of the fourth NMOS transistor and the ground node. The at least one NMOS transistor array may correspond to first to fourth transistor arrays TA_1, TA_2, TA_3, and TA_4 of FIG. 4.

According to an example embodiment, the first sub-driver may include one or more first output resistors, one or more second output resistors, one or more first switches, and one or more second switches, wherein the first switch is connected to the first output node and one end of the first output resistor, the second switch is connected to the second output node and one end of the second output resistor, and the first switch and the second switch may be determined to be opened or closed based on a switch control signal. The one or more first output resistors may correspond to a plurality of resistors R1 to Rk of FIG. 5, and the one or more second output resistors may correspond to a plurality of resistors R_1 to R_k of FIG. 5.

According to an example embodiment, the NMOS-based driver 102 may include a plurality of cell drivers. Each of the plurality of cell drivers may include a cell switch and at least one first driver. Based on a cell switch control signal, the opening or closing of a cell switch of each of the plurality of cell drivers may be determined. The plurality of cell drivers may correspond to a plurality of cell drivers 103_1 to **103_*k* of FIG. 6**A.

According to an example embodiment, the NMOS-based driver 102 may further include a second sub-driver with sixth to ninth NMOS transistors, and may be configured to receive third and fourth clock signals, and output third and fourth low swing clock signals. The second sub-driver may correspond to a 2-phase driver 102_2. The sixth NMOS transistor may be connected between the output node of the regulator voltage and the third output node, the seventh NMOS transistor may be connected between the third output node and the ground node, a third clock signal may be input to a gate terminal of the sixth NMOS transistor, the fourth clock signal may be input to a gate terminal of the seventh NMOS transistor, and a third low swing clock signal may be output through the third output node. The eighth NMOS transistor may be connected between the output node of the regulator voltage and the fourth output node, the ninth NMOS transistor may be connected between the fourth output node and the ground node, the fourth clock signal may be input to a gate terminal of the eighth NMOS transistor, the third clock signal may be input to a gate terminal of the ninth NMOS transistor, and a fourth low swing clock signal may be output through the fourth output node. The third to fourth clock signals may have a phase difference of 180 degrees from each other. Because the structure of the second driver is the same as that of the first driver, the structure and operation of the second driver may be understood through FIGS. 3A and 3B.

The electronic device 10 according to an example embodiment may include the clock signal distribution circuit 100 including an NMOS-based regulator 101 configured to receive a first voltage and output a regulator voltage having a lower voltage level than the first voltage through a regulator voltage output node, and an NMOS-based driver 102 including first to fourth NMOS transistors and a sub-driver configured to receive first and second clock signals and output first and second low swing clock signals. The phase interpolator 201 may be configured to receive a first low swing clock signal and a second low swing clock signal through the PMOS-based input buffer 202. The first NMOS transistor may be connected between an output node of a regulator voltage and a first output node, and the second NMOS transistor may be connected between the first output node and a ground node. A first clock signal may be input to a gate terminal of the first NMOS transistor, a second clock signal may be input to a gate terminal of the second NMOS transistor, and a first low swing clock signal may be output through the first output node. The third NMOS transistor may be connected between the output node of the regulator voltage and a second output node, the fourth NMOS transistor may be connected between the second output node and the ground node. A second clock signal may be input to a gate terminal of the third NMOS transistor, a first clock signal may be input to a gate terminal of the fourth NMOS transistor, and a second low swing clock signal may be output through the second output node. The NMOS-based regulator 101 may include the fifth NMOS transistor as a pass transistor.

Figure 2:
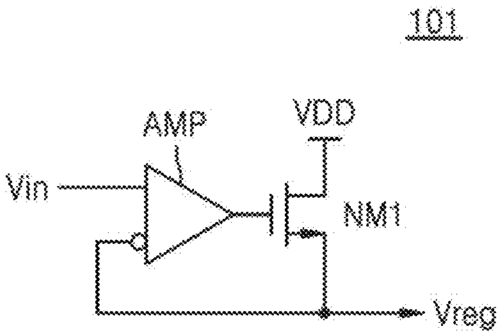
FIG. 2 shows a circuit diagram of an NMOS-based regulator, according to an example embodiment.

FIG. 2 shows a circuit diagram of the NMOS-based regulator 101 of FIG. 1, according to an example embodiment.

Referring to FIG. 2, the NMOS-based regulator 101 according to an example embodiment may include an amplifier AMP and a transistor NM1. According to an example embodiment, the amplifier AMP may be an error amplifier. The transistor NM1 may include an n-type MOSFET. The NMOS-based regulator 101 may receive an input voltage Vin and output a regulator voltage Vreg that is lower than the input voltage Vin. According to an example embodiment, the regulator voltage Vreg may have a magnitude of 400 mV or less. The NMOS-based regulator 101 may further include other configurations depending on the situation.

Figure 3A:
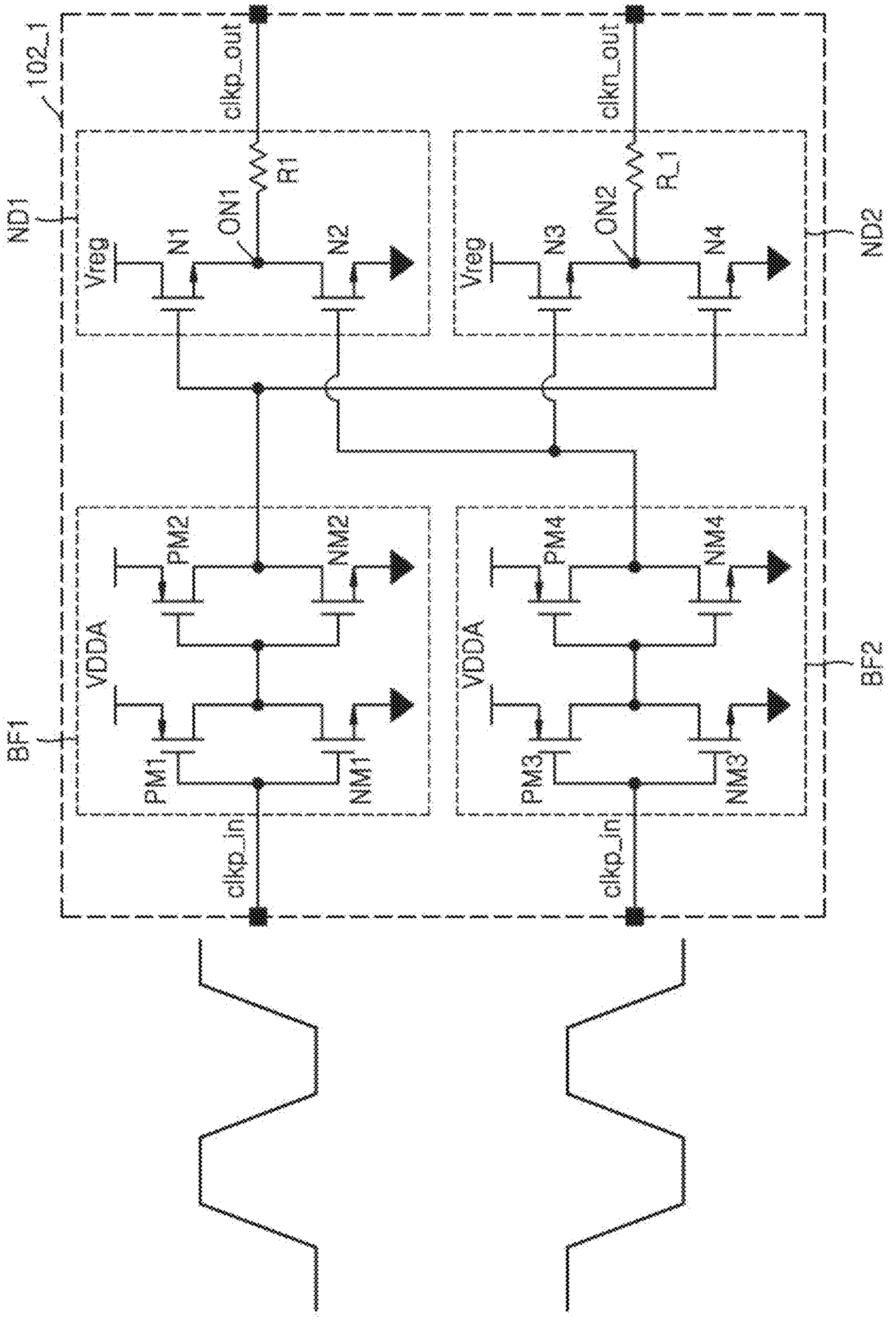
FIG. 3A is a circuit diagram for explaining a 2-phase driver according to an example embodiment.

FIG. 3A is a circuit diagram to explain the 2-phase driver 102_1 of FIG. 1, according to an example embodiment.

FIG. 3A will be described with reference to FIG. 1. Referring to FIG. 3A, the 2-phase driver 102_1 according to an example embodiment may receive a first input clock signal clkp_in and a second input clock signal clkn_in from the outside. For example, the 2-phase driver 102_1 may receive the first input clock signal clkp_in and the second input clock signal clkn_in from the PLL 300. The first input clock signal clkp_in and the second input clock signal clkn_in may have a phase difference of 180 degrees from each other. The 2-phase driver 102_1 may include CMOS buffers BF1 and BF2 including CMOS inverters. The 2-phase driver 102_1 may include drivers ND1 and ND2. The driver ND1 may include a first transistor N1 and a second transistor N2. In addition, the driver ND1 may further include a resistor R1. The driver ND2 may include a third transistor N3 and a fourth transistor N4. Also, the driver ND2 may further include a resistor R_1. The first to fourth transistors N1 to N4 are all NMOS transistors. A regulator voltage Vreg may be input to drain terminals of the first transistor N1 and the third transistor N3.

The CMOS buffer BF1 includes two CMOS inverters. Specifically, the CMOS buffer BF1 may include a first CMOS inverter and a second CMOS inverter. The first CMOS inverter may include a first PMOS transistor PM1 and a first NMOS transistor NM1, and the second CMOS inverter may include a second PMOS transistor PM2 and a second NMOS transistor NM2. An analog supply voltage VDDA is applied to each source terminal of the first PMOS transistor PM1 and the second PMOS transistor PM2.

The CMOS buffer BF2 may include a third CMOS inverter and a fourth CMOS inverter. The third CMOS inverter may include a third PMOS transistor PM3 and a third NMOS transistor NM3, and the fourth CMOS inverter may include a fourth PMOS transistor PM4 and a fourth NMOS transistor NM4. An analog supply voltage VDDA may be applied to each source terminal of the third PMOS transistor PM3 and the fourth PMOS transistor PM4.

A first input clock signal clkp_in may be input to gate terminals of the first PMOS transistor PM1 and the first NMOS transistor NM1. A second input clock signal clkn_in may be input to gate terminals of the third PMOS transistor PM3 and the third NMOS transistor NM3.

The CMOS buffer BF1 may transmit the first input clock signal clkp_in to the drivers ND1 and ND2. Specifically, the first input clock signal clkp_in may be input to the gate terminals of the first transistor N1 and the fourth transistor N4.

The CMOS buffer BF2 may transmit the second input clock signal clkn_in to the drivers ND1 and ND2. Specifically, the second input clock signal clkn_in may be input to the gate terminals of the second transistor N2 and the third transistor N3.

The driver ND1 may output the first output clock signal clkp_out for the first input clock signal clkp_in through the first output node ON1. The driver ND2 may output the second output clock signal clkn_out for the second input clock signal clkn_in through the second output node ON2. The drivers ND1 and ND2 may output a first output clock signal (e.g., clkp_out in FIG. 3) and a second output clock signal clkn_out as a low swing clock signal LS_CLK.

According to an example embodiment, as the NMOS-based driver 102 includes two 2-phase drivers 102_1, the NMOS-based driver 102 may output 4-phase clock signals as low swing clock signals.

The 2-phase driver 102_1 may include various numbers of CMOS inverters and is not limited to the example of FIG. 2. For convenience of explanation in FIGS. 3 to 5, one 2-phase driver 102_1 is described as a reference, and internal structures of one or more 2-phase drivers included in the NMOS-based driver 102 may all be the same.

Figure 3B:
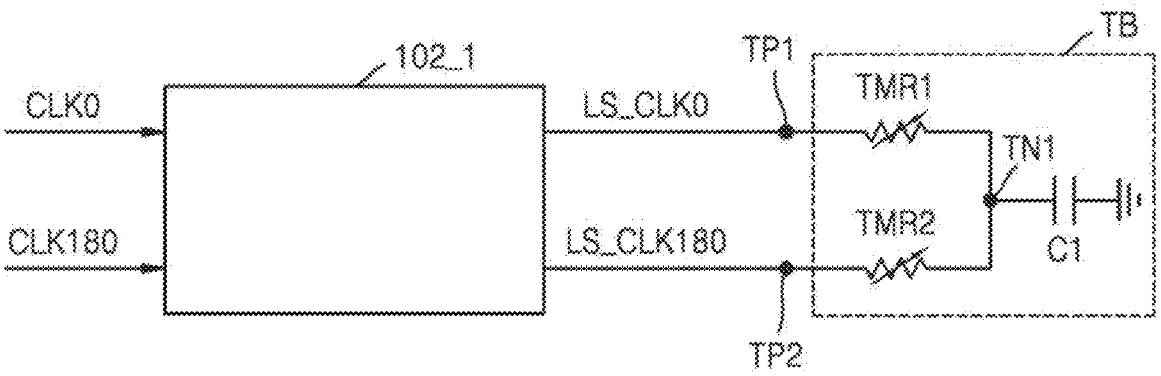
FIG. 3B is a circuit showing an operation of a 2-phase driver according to an example embodiment.

FIG. 3B is a circuit showing an operation of a 2-phase driver according to an example embodiment.

FIG. 3B will be described with reference to FIG. 1 and FIG. 3A. The first clock signal CLK0 may correspond to the first input clock signal clkp_in. The second clock signal CLK180 may correspond to the second input clock signal clkn_in. The first low swing clock signal LS_CLK0 may correspond to the first output clock signal clkp_out. The first low swing clock signal LS_CLK0 may be output through the first output node ON1. The second low swing clock signal LS_CLK180 may correspond to the second output clock signal clkn_out. The second low swing clock signal LS_CLK180 may correspond to the second output node ON2.

Referring to FIG. 3B, termination resistors TMR1 and TMR2 may be located in a terminal block TB which is the front part of the PMOS-based input buffer. The termination resistor TMR1 may be connected between a node TP1 and a terminal node TN1. The termination resistor TMR2 may be connected between a node TP2 and the terminal node TN1. A capacitor C1 may be connected between the terminal node TN1 and the ground node.

When the first clock signal CLK0 is at a logic high level, the first PMOS transistor PM1 and the second PMOS transistor PM2 of the CMOS buffer BF1 may be turned off, and the first NMOS transistor NM1 and the second NMOS transistor NM2 may be turned on. Accordingly, the first clock signal CLK0 may be input to the gate terminal of the first transistor N1 and the gate terminal of the fourth transistor N4 through the CMOS buffer BF1. In this case, the gate terminal of the first transistor N1 and the fourth transistor N4 may be turned on. When the first clock signal CLK0 is at a logic high level, the second clock signal CLK180 may be at a logic low level. The third PMOS transistor PM3 and the fourth PMOS transistor PM4 may be turned on, and the third NMOS transistor NM3 and the fourth NMOS transistor NM4 may be turned off. Accordingly, the second clock signal CLK180 may be input to the gate terminal of the second transistor N2 and the gate terminal of the third transistor N3 through the CMOS buffer BF2. In this case, the second transistor N2 and the third transistor N3 may be turned off. As a result, the first low swing clock signal LS_CLK0 may have a voltage level that is lowered by the resistor R1 from the voltage level of the regulator voltage Vreg. According to an example embodiment, the drop of voltage level by the resistor R1 may be ignored. The second low swing clock signal LS_CLK180 may have a voltage level that is lowered according to the resistor R_1 from the voltage level of the regulator voltage Vreg. In an example embodiment, the drop of voltage level by the resistor R_1 may be ignored.

When the first clock signal CLK0 is at a logic low level, the transistors inside the 2-phase driver 102_1 may operate in an opposite manner to when the first clock signal CLK0 is at a logic high level.

When the NMOS-based driver 102 is configured to use two 2-phase drivers 102_1 and 102_2, one 2-phase driver 102_1 may receive the first clock signal CLK0 and the second clock signal CLK180, and the other 2-phase driver 102_2 may receive a third clock signal CLK90 and a fourth clock signal CLK270.

According to another example embodiment, in a 2-phase driver 402_1 (see FIG. 11) of a PMOS-based driver 402 (see FIG. 11), first to fourth transistors N1 to N4 may be changed to p-type transistors, a supply voltage (e.g., VDDA) may be applied to a drain terminal of the first transistor N1, a regulator voltage Vreg may be applied to a source terminal of the second transistor N2, a supply voltage may be applied to a drain terminal of the third transistor N3, and a regulator voltage Vreg may be applied to a source terminal of the fourth transistor N4.

Figure 4:
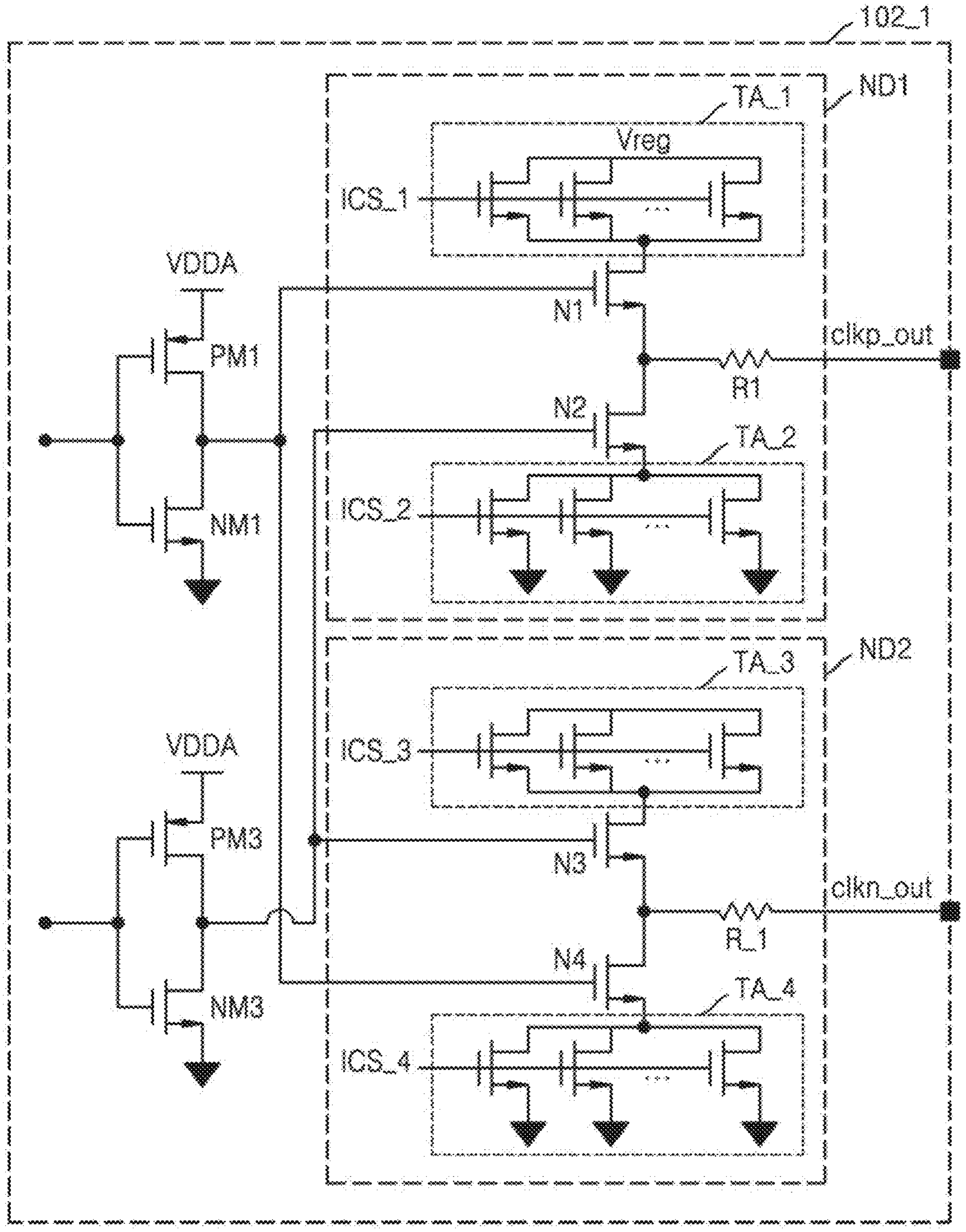
FIG. 4 shows a circuit diagram of a 2-phase driver according to an example embodiment.

FIG. 4 shows a circuit diagram of a 2-phase driver according to an example embodiment.

FIG. 4 will be described with reference to FIG. 1 and FIG. 3, and the descriptions thereof will not be repeated. Unlike FIG. 3A, the drivers ND1 and ND2 of FIG. 4 are each connected to one CMOS inverter, but this is for convenience of description, and the number of CMOS inverters may vary. Referring to FIG. 4, the 2-phase driver 102_1 may include one or more transistor arrays for controlling an impedance of the drivers ND1 and ND2.

According to an example embodiment, the 2-phase driver 102_1 may include first to fourth transistor arrays TA_1, TA_2, TA_3, and TA_4. The first to fourth transistor arrays TA_1, TA_2, TA_3, and TA_4 are arrays in which gate terminals of one or more NMOS transistors are connected to each other, respectively. A source terminal of the first transistor array TA_1 can be connected to a drain terminal of the first transistor N1. A regulator voltage Vreg may be input to the drain terminal of the first transistor array TA_1. The first to fourth transistor arrays TA_1, TA_2, TA_3, and TA_4 may receive first to fourth impedance control signals ICS_1, ICS_2, ICS_3, and ICS4 via their gate terminals, respectively. The first to fourth transistor arrays TA_1, TA_2, TA_3, and TA_4 may have different numbers of transistors turned on based on the first to fourth impedance control signals ICS_1, ICS_2, ICS_3, and ICS_4. Accordingly, a composite turn-on resistance value of each of the first to fourth transistor arrays TA_1, TA_2, TA_3, and TA_4 may be changed, and the impedance of the 2-phase driver 102_1 may be adjusted.

Figure 5:
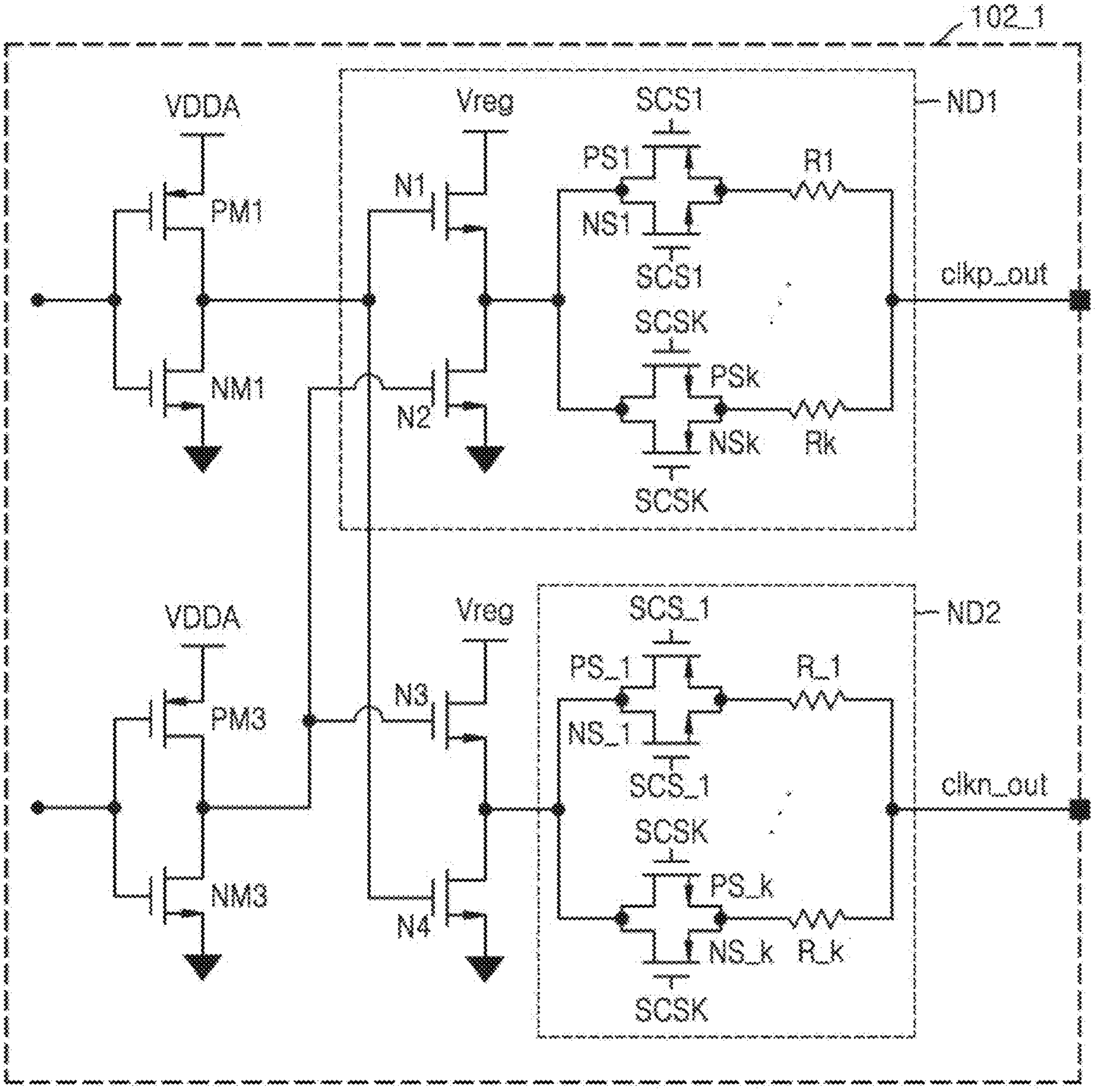
FIG. 5 shows a circuit diagram of a 2-phase driver according to an example embodiment.

FIG. 5 shows a circuit diagram of a 2-phase driver according to an example embodiment.

FIG. 5 will be described with reference to FIG. 1 and FIG. 3, and the descriptions thereof will not be repeated. Unlike FIG. 3, drivers ND1 and ND2 of FIG. 5 are each connected to one CMOS inverter, but this is for convenience of description, and the number of CMOS inverters may vary.

The 2-phase driver 102_1 may include one or more CMOS inverters and drivers ND1 and ND2. The driver ND1 may include a plurality of resistors R1 to Rk for impedance adjustment. Each of the plurality of resistors R1 to Rk may be connected to the first transistor N1 and a second transistor N2 based on a switch. The switches may receive a switch control signal from the outside. Based on the switch control signal, each of the plurality of resistors R1 to Rk may or may not be connected to the first transistor N1 and the second transistor N2. Accordingly, the total resistance value of the plurality of resistors R1 to Rk may be adjusted.

The driver ND2 may include a plurality of resistors R_1 to R_k for impedance adjustment. Each of the plurality of resistors R_1 to R_k may be connected to a third transistor N3 and a fourth transistor N4 based on a switch. The switches may receive a switch control signal from the outside. Based on the switch control signal, each of the plurality of resistors R_1 to R_k may be or may not be connected to the third transistor N3 and the fourth transistor N4. Accordingly, the total resistance value of the plurality of resistors R_1 to R_k may be adjusted.

As a specific example, the resistor R1 of the driver ND1 may be connected to the source terminal of each of transistors PS1 and NS1. A switch control signal SCS1 may be input to a gate terminal of the transistors PS1 and NS1. Based on the switch control signal SCS1, the transistors PS1 and NS1 may be turned on or off. The resistor R_k may be connected to the source terminal of each of the transistors PSk and NSk. A switch control signal SCSk may be input to the gate terminal of the transistors PSk and NSk. Based on the switch control signal SCSk, the transistors PSk and NSk may be turned on or turned off. The resistor R_1 of the driver ND2 may be connected to a source terminal of each of the transistors PS_1 and NS_1. A switch control signal SCS_1 may be input to a gate terminal of the transistors PS_1 and NS_1. Based on the switch control signal SCS_1, the transistors PS_1 and NS_1 may be turned on or turned off. The resistor R_k may be connected to a source terminal of each of the transistors PS_k and NS_k. A switch control signal SCS_k may be input to a gate terminal of the transistors PS_k and NS_k. Based on the switch control signal SCS_k, the transistors PS_k and NS_k may be turned on or turned off.

The switch for controlling values of the resistors of the drivers ND1 and ND2 may be implemented in various ways and is not limited to the examples described above.

Figure 6A:
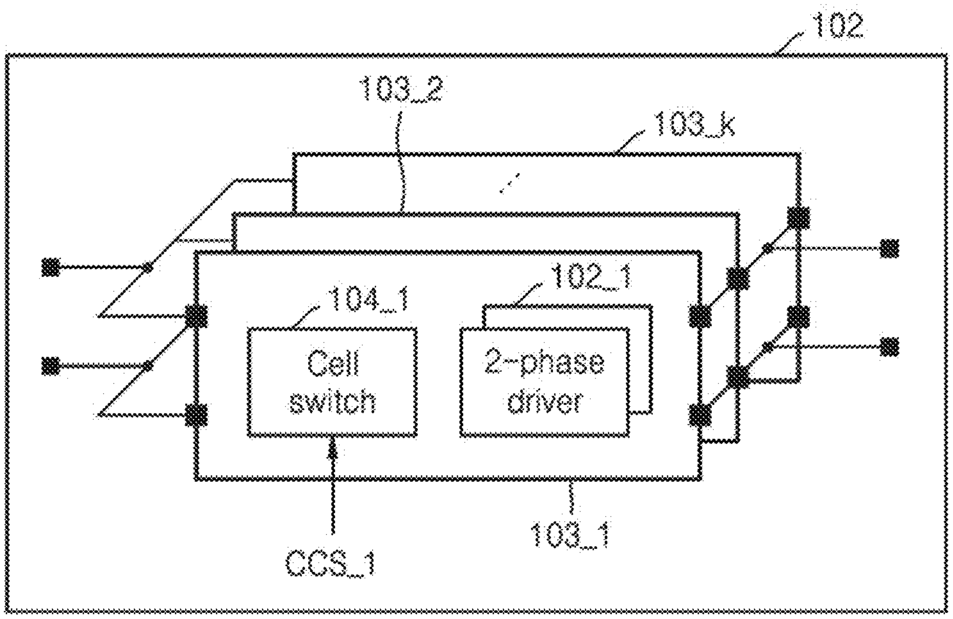
FIG. 6A is a block diagram of an NMOS-based driver, according to an example embodiment.

FIG. 6A shows a block diagram of the NMOS-based driver 102 of FIG. 1, according to an example embodiment.

FIG. 6A will be described with reference to FIG. 1. Referring to FIG. 6A, the NMOS-based driver 102 may include a plurality of cell drivers 103_1 to **103_*k*. Each of the plurality of cell drivers 103_1 to 103_*k* may include a cell switch. For example, the cell driver 103_1 may include a cell switch 104_1. The cell switch 104_1 may activate the cell driver 103_1 based on a cell switch control signal CCS_1. Each of the cell drivers 103_1 to 103_*k* may include one or more 2-phase drivers 102_1 and 102_2**.

Figure 6B:
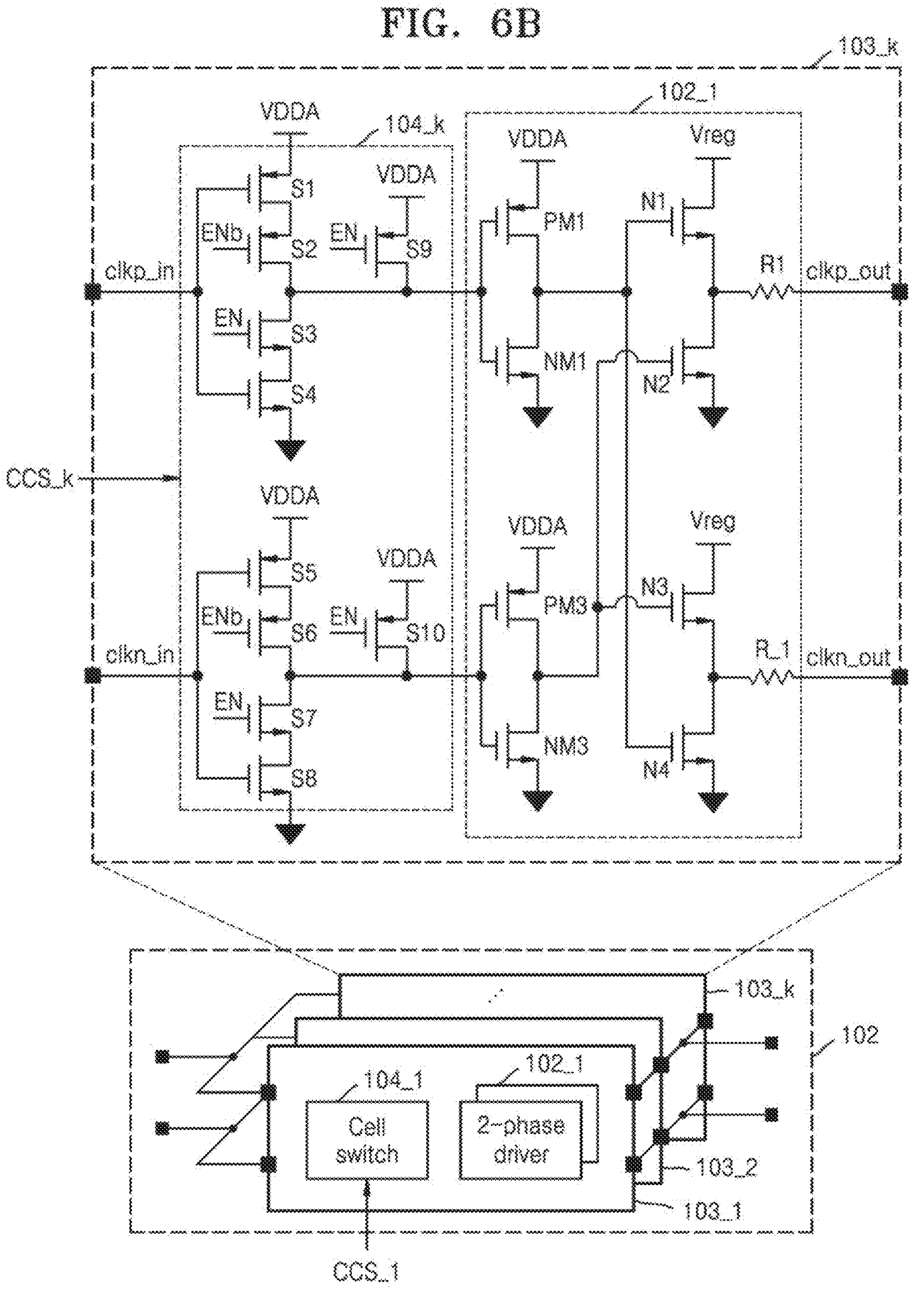
FIG. 6B shows a circuit diagram of an NMOS-based driver, according to an example embodiment.

FIG. 6B shows a circuit diagram of the NMOS-based driver of FIG. 6A, according to an example embodiment.

FIG. 6B will be described with reference to FIG. 1 and FIG. 6A. Referring to FIG. 6B, the NMOS-based driver 102 may include a plurality of cell drivers 103_1 to **103_*k*. Each of the plurality of cell drivers 103_1 to 103_*k* may include a cell switch and one or more 2-phase drivers 102_1. The cell driver 103_*k*** will be described as an example.

The cell driver **103_*k* may include a cell switch circuit 104_*k* and a 2-phase driver 102_1. When the cell switch circuit 104_*k* receives a cell switch control signal CCS, the cell switch circuit 104_*k* may receive a first input clock signal clkp_in and a second input clock signal clkn_in and transmit them to the 2-phase driver 102_1**.

The cell switch control circuit CCS may include a high-level activation signal EN and a low-level activation signal ENb. The cell switch circuit **104_*k* may include transistors S1 to S10. A high-level activation signal EN may be input to gate terminals of the transistors S3, S7, S9, and S10. Accordingly, the transistors S3, S7, S9, and S10 may be turned on. A low-level activation signal ENb may be input to gate terminals of the transistors S2 and S6. Accordingly, the transistors S2 and S6 may be turned on. Accordingly, the cell driver 103_*k*** may be turned on.

The cell switches 104_1 to **104_*k*** may be implemented in various ways and are not limited to the examples described above.

The impedance of the NMOS-based driver 102 may be controlled as described with reference to FIGS. 4 to 6A and 6B. For example, the impedance of the NMOS-based driver 102 may be controlled by a processor included in the electronic device 10. The impedance of the NMOS-based driver 102 may be adjusted based on a speed of the low swing clock signal LS_CLK. For example, the impedance of the NMOS-based driver 102 may be controlled in a direction that increases when the speed of the low swing clock signal LS_CLK is high. In another example, the impedance of the NMOS-based driver 102 may be controlled in a direction decreasing when the speed of the low swing clock signal LS_CLK is low.

Figure 7:
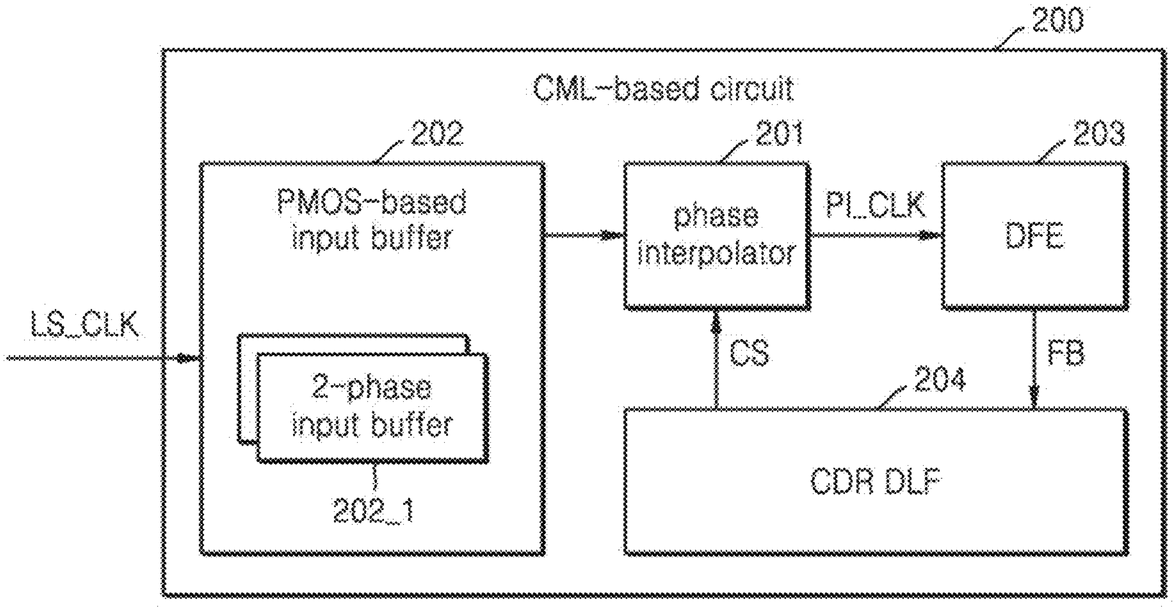
FIG. 7 is a block diagram of a CML-based circuit, according to an example embodiment.

FIG. 7 shows a block diagram of the CML-based circuit 200 of FIG. 1, according to an example embodiment.

FIG. 7 will be described with reference to FIG. 1, and the descriptions thereof will not be repeated. Referring to FIG. 7, the CML-based circuit 200 may include the phase interpolator 201, the PMOS-based input buffer 202, a decision feedback equalization (DFE) 203, and a clock data recovery digital loop filter (CDR DLF) 204. According to an example embodiment, the CML-based circuit 200 may be a reception circuit.

The PMOS-based input buffer 202 does not include an NMOS transistor but includes one or more PMOS transistors. The PMOS-based input buffer 202 may receive a low swing clock signal LS_CLK from the NMOS-based driver 102.

The phase interpolator 201 may receive the low swing clock signals LS_CLK through the PMOS-based input buffer 202 and perform an interpolation operation on the received signals. The phase interpolator 201 may output clock signals having interpolated phases using the low swing clock signals LS_CLK.

The DFE 203 may quantize the signals received from the phase interpolator 201 and generate feedback symbols.

The CDR DLF 204 may generate a control signal CS that controls the phase interpolator 201 based on the feedback FB received from the DFE 203. The phase interpolator 201 may generate a phase interpolation clock signal PI_CLK based on the control signal CS.

The CML-based circuit 200 may further include various configurations for processing signals, and embodiments are not limited to the above-described configurations.

Figure 8:
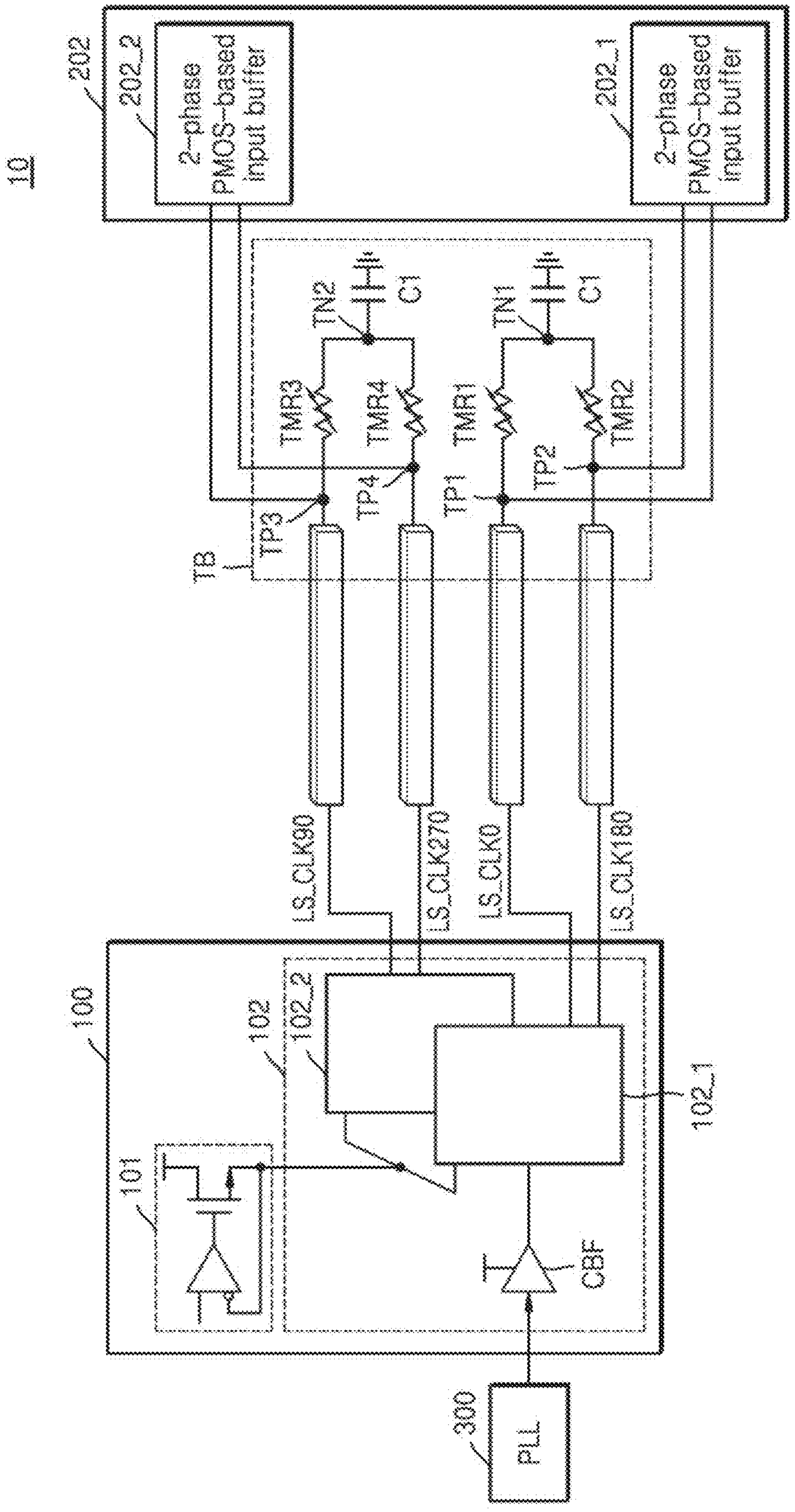
FIG. 8 shows a circuit diagram of an electronic device, according to an example embodiment.

FIG. 8 shows a circuit diagram of the electronic device 10 of FIG. 1, according to an example embodiment. FIG. 8 includes an input buffer of the phase interpolator 201.

FIG. 8 will be described with reference to FIG. 1 and FIG. 2, and the descriptions thereof will not be repeated. Referring to FIG. 8, the PLL 300 may transmit a 4-phase clock signal to a CMOS buffer CBF of the clock signal distribution circuit 100. The NMOS-based driver 102 may include two 2-phase drivers 102_1 and 102_2.

The PMOS-based input buffer 202 may include one or more 2-phase PMOS-based input buffers 202_1. The NMOS-based driver 102 may transmit a low swing clock signal to the phase interpolator 201. The NMOS-based driver 102 may include two 2-phase drivers 102_1 and 102_2 and may transmit a 4-phase low swing clock signal to the PMOS-based input buffer 202.

For example, the 2-phase driver 102_1 may transmit a first low swing clock signal LS_CLK0 having a phase of 0 degrees and a second low swing clock signal LS_CLK180 having a phase of 180 degrees to the 2-phase PMOS-based input buffer 202_1. The 2-phase driver 102_2 may transmit a third low swing clock signal LS_CLK90 having a phase of 90 degrees and a fourth low swing clock signal LS_CLK270 having a phase of 270 degrees to the 2-phase PMOS-based input buffer 202_2. The electronic device 10 may have a source series termination (SST) structure. A termination resistor TMR1 may be connected between a node TP1 and a terminal node TN1. A termination resistor TMR2 may be connected between a node TP2 and the terminal node TN1. A termination resistor TMR3 may be connected between a node TP3 and the terminal node TN2. A termination resistor TMR4 may be connected between a node TP4 and the terminal node TN2.

The termination resistors TMR1, TMR2, TMR3, and TMR4 may be located in a terminal block TB, which is a front part of the PMOS-based input buffer 202. Accordingly, the rising time and falling time of the high-speed clock signal transmitted by the NMOS-based driver 102 to the phase interpolator 201 may be insensitive to a process corner of a transistor. The termination resistors TMR1, TMR2, TMR3, and TMR4 may include variable resistors. According to an example embodiment, a termination resistor value may be adjusted based on the speed of the low swing clock signals LS_CLK0, LS_CLK90, LS_CLK180, and LS_CLK270. Accordingly, power consumption may be reduced.

Figure 9A:
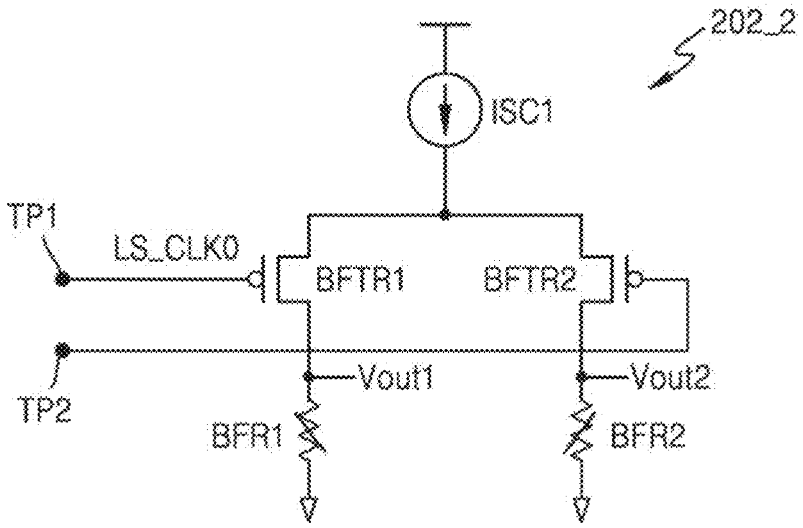
FIGS. 9A and 9B are diagrams illustrating an operation of a circuit of a PMOS-based input buffer according to an example embodiment.
Figure 9B:
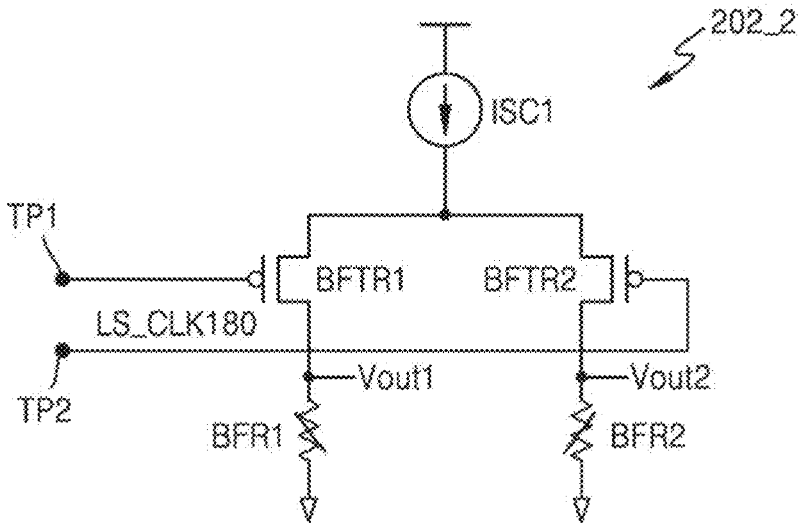

FIGS. 9A and 9B are diagrams illustrating an operation of a circuit diagram of a PMOS-based input buffer 202_1 according to an example embodiment.

FIG. 9A and FIG. 9B will be described with reference to FIG. 1 and FIG. 8, and the descriptions thereof will not be repeated. Referring to FIG. 9A and FIG. 9B, the PMOS-based input buffer 202_1 may include a current source ISC1, a first transistor BFTR1, a second transistor BFTR2, a first resistor BFR1, and a second resistor BFR2.

Referring to FIG. 9A, a low swing clock signal LS_CLK0 output by the NMOS-based driver 102 may be input to a gate terminal of the first transistor BFTR1 through a node TP1. When the low swing clock signal LS_CLK0 is input to the gate terminal of the first transistor BFTR1, the first transistor BFTR1 may be turned off. In addition, when the low swing clock signal LS_CLK0 is input to the gate terminal (i.e., node TP1) of the first transistor BFTR1, as described above with reference to FIG. 3B, a voltage lower than a voltage level of the low swing clock signal LS_CLK0 may be input to a gate terminal (i.e., node TP2) of the second transistor BFTR2. Accordingly, the first transistor BFTR1 may be turned off and the second transistor BFTR2 may be turned on. Accordingly, a voltage Vout2 of one end of the second resistor BFR2 may be output.

Referring to FIG. 9B, the low swing clock signal LS_CLK180 output by the NMOS-based driver 102 may be input to the gate terminal of the second transistor BFTR2 through the node TP1. When the low swing clock signal LS_CLK180 is input to the gate terminal of the second transistor BFTR2, the second transistor BFTR2 may be turned off. In addition, when the low swing clock signal LS_CLK180 is input to the gate terminal (i.e., node TP2) of the second transistor BFTR2, as described above with reference to FIG. 3B, a voltage lower than a voltage level of the low swing clock signal LS_CLK180 may be input to the gate terminal (i.e., node TP1) of the first transistor BFTR1. Accordingly, the second transistor BFTR2 may be turned off and the first transistor BFTR1 may be turned on. Accordingly, a voltage Vout1 of one end of the first resistor BFR2 may be output.

Figure 10:
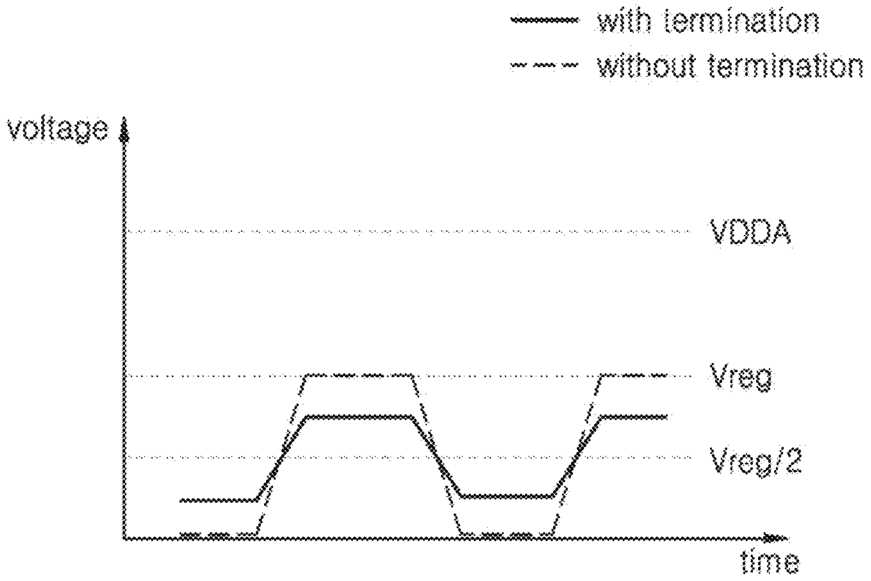
FIG. 10 illustrates a voltage graph applied to a PMOS-based input buffer according to operation of a clock signal distribution circuit according to an example embodiment.

FIG. 10 shows a voltage graph applied to a PMOS-based input buffer according to an operation of the clock signal distribution circuit 100 of FIG. 1.

FIG. 10 will be described with reference to the drawings described above. The dashed line of FIG. 10 shows a waveform of a signal output by the NMOS-based driver 102 when there are no termination resistors TMR1 and TMR2 in the terminal block TB (without termination), unlike the example of FIG. 8. That is, if there are no termination resistors TMR1 and TMR2 in the terminal block TB (without termination), waveforms of the first to fourth low swing clock signals LS_CLK0, LS_CLK90, LS_CLK180, and LS_CLK270 may be the same as the dashed line of FIG. 10. The common mode level may be Vreg/2, and the first to fourth low swing clock signals LS_CLK0, LS_CLK90, LS_CLK180, and LS_CLK270 may swing between a level of the regulator voltage Vreg and the ground voltage level.

The solid line in FIG. 10 represents a waveform of a signal output by the NMOS-based driver 102 when the termination resistors TMR1 and TMR2 of the terminal block TB are present (with termination) as in the example of FIG. 8. That is, if the termination resistors TMR1 and TMR2 are present in the terminal block TB (with termination), waveforms of the first to fourth low swing clock signals LS_CLK0, LS_CLK90, LS_CLK180, and LS_CLK270 may be the same as the solid line in FIG. 10. If the termination resistors TMR1 and TMR2 are not present in the terminal block TB (without termination), waveforms of the first to fourth low swing clock signals LS_CLK0, LS_CLK90, LS_CLK180, and LS_CLK270 may be the same as the dashed line in FIG. 10. The common mode level may be Vreg/2, and the first to fourth low swing clock signals LS_CLK0, LS_CLK90, LS_CLK180, and LS_CLK270 may swing between a level lower than the level of the regulator voltage Vreg and a level greater than the level of the ground voltage.

The voltage level over time in FIG. 10 may mean the voltage level at the node TP1 or the node TP2 of the first to fourth low swing clock signals LS_CLK0, LS_CLK90, LS_CLK180, and LS_CLK270.

When the NMOS-based regulator 101 and the NMOS-based driver 102 transmit a low swing clock signal LS_CLK to the PMOS-based input buffer 202, the common mode level may be Vreg/2. In addition, when termination resistors TMR1 and TMR2 are included in the terminal block TB (with termination), a ground (VSS) reference signaling is possible.

Figure 11:
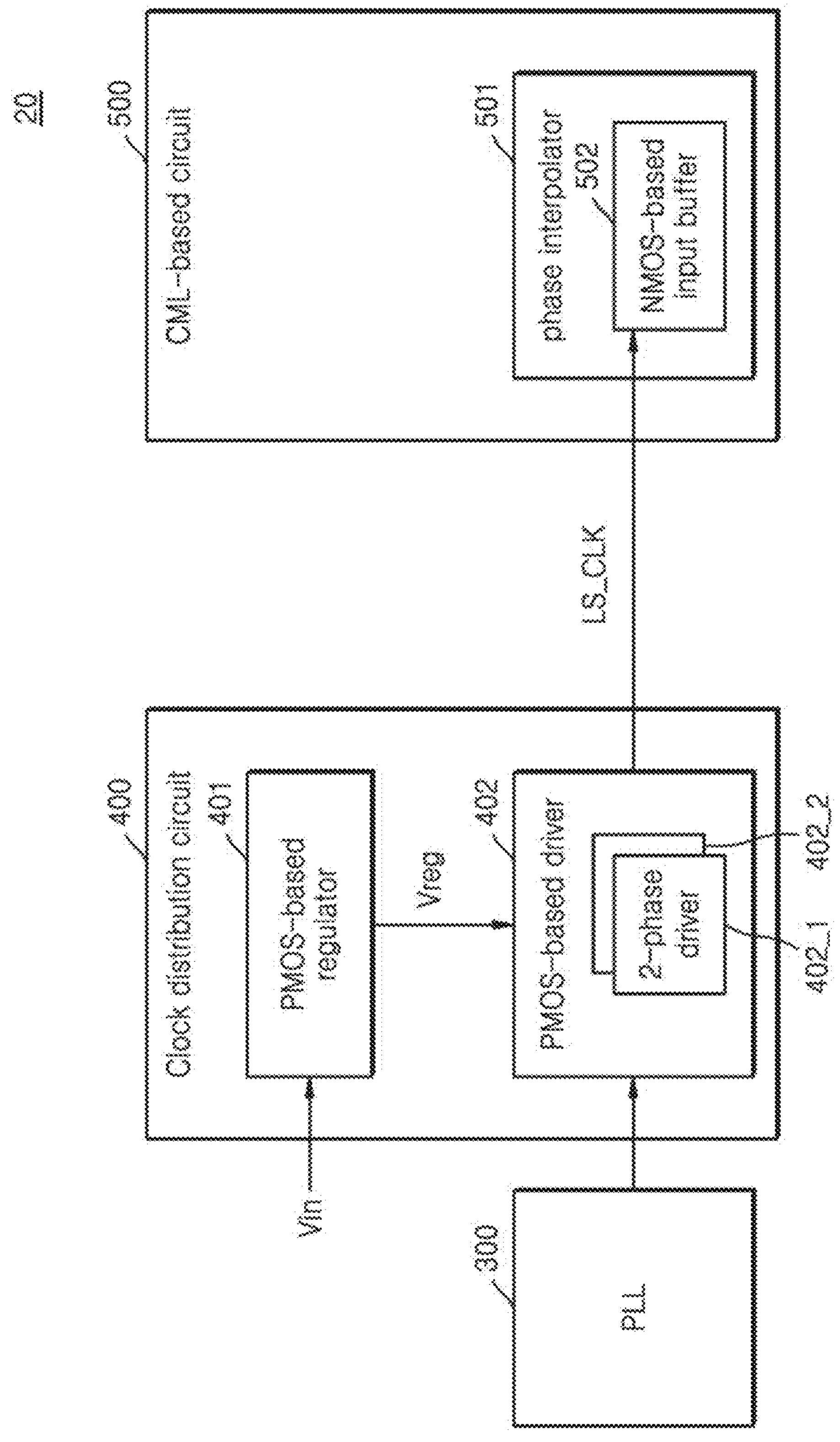
FIG. 11 illustrates an electronic device according to an example embodiment.

FIG. 11 illustrates an electronic device 20 according to an example embodiment.

Referring to FIG. 11, the electronic device 20 may include a clock signal distribution circuit 400. Unlike FIG. 1, the clock signal distribution circuit 400 of FIG. 11 is based on PMOS, and a phase interpolator 501 is based on NMOS. The clock signal distribution circuit 400 is included in the electronic device 20 and may receive a CMOS signal from an external device of the clock signal distribution circuit 400. Alternatively, the clock signal distribution circuit 400 may receive a CMOS signal from a circuit outside the electronic device 20. For example, the clock signal distribution circuit 400 may receive a CMOS signal from a processor.

The clock signal distribution circuit 400 according to an example embodiment may include a PMOS-based regulator 401 and a PMOS-based driver 402. That is, both the regulator and the driver of the clock signal distribution circuit 400 may be based on PMOS. The PMOS-based regulator 401 includes an LDO that includes only a p-type MOSFET and does not include an n-type MOSFET. The PMOS-based regulator 401 may receive an input signal Vin from the outside and output a regulator voltage Vreg having a reduced voltage.

The PMOS-based driver 402 according to an example embodiment may receive clock signals from a PLL 300. For example, the PMOS-based driver 402 may receive CMOS signals from the PLL 300 and transmit a CML signal to a CML-based circuit 500. The CMOS signal may be a signal that swings between a power supply voltage and a ground voltage, and the CML signal may be a signal that swings with a specific swing width based on a preset CML reference level (common mode level). The swing width of the CML signal may be less than that of the CMOS signal, and the CML signal may operate as a high-frequency clock signal capable of performing high-speed switching.

The PMOS-based driver 402 may include one or more 2-phase drivers 402_1 and 402_2. The 2-phase drivers 402_1 and 402_2 may include a driver and one or more CMOS inverters for generating a low swing clock signal LS_CLK to be transmitted to the phase interpolator 501.

According to an example embodiment, the PMOS-based driver 402 configured to receive a 2-phase clock signal from the PLL 300 may include one 2-phase driver 402_1. In an example embodiment, the PMOS-based driver 402 is configured to receive a 4-phase clock signal from the PLL 300 therefore includes two 2-phase drivers 402_1 and 402_2. The PMOS-based driver 402 may transmit a low swing signal LS_CLK to the phase interpolator 501 based on the regulator voltage Vreg and the 4-phase clock signal received from the PLL 300. The PMOS-based driver 402 may include a variety of 2-phase drivers 402_1 and the number of 2-phase drivers 402_1 is not limited thereto.

According to an example embodiment, the PMOS-based driver 402 may transmit a low swing clock signal LS_CLK to the phase interpolator 501. Here, the phase interpolator 501 may receive the low swing clock signal LS_CLK through an NMOS-based input buffer 502 including an NMOS. According to an example embodiment, the phase interpolator 501 may include the NMOS-based input buffer 502. In another example embodiment, the NMOS-based input buffer 502 may be located outside the phase interpolator 501.

According to an example embodiment, the clock signal distribution circuit 400 may include the PMOS-based regulator 401 configured to receive a first voltage and output a regulator voltage having a lower voltage level than the first voltage through a regulator voltage output node and the PMOS-based driver 402 including a first sub-driver with first to fourth PMOS transistors, and may be configured to receive first and second clock signals and output first and second low swing clock signals. The first PMOS transistor may be connected between a supply voltage input node and a first output node, and the second PMOS transistor may be connected between the first output node and an output node of a regulator voltage. A first clock signal may be input to a gate terminal of the first PMOS transistor, a second clock signal may be input to a gate terminal of the second PMOS transistor, and a first low swing clock signal may be output through the first output node. The third PMOS transistor may be connected between the supply voltage input node and the second output node, and the fourth PMOS transistor may be connected between the second output node and an output node of a regulator voltage. A second clock signal may be input to a gate terminal of the third PMOS transistor, a first clock signal may be input to a gate terminal of the fourth PMOS transistor, and a second low swing clock signal may be output through the second output node. The PMOS-based regulator may include a fifth PMOS transistor as a pass transistor.

Figure 12A:
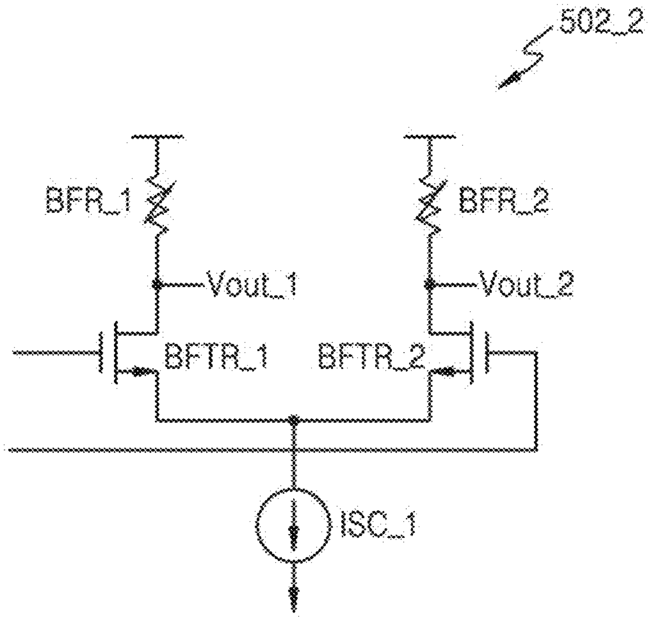
FIG. 12A illustrates an NMOS-based input buffer circuit according to an example embodiment.

FIG. 12A illustrates a circuit diagram of the NMOS-based input buffer of FIG. 11, according to an example embodiment.

Referring to FIG. 12A, an NMOS-based input buffer 502_2 may include a current source ISC_1, a first transistor BFTR_1, a second transistor BFTR_2, a first resistor BFR_1, and a second resistor BFR_2. The first transistor BFTR_1 and the second transistor BFTR_2 may include n-type MOSFET transistors.

Figure 12B:
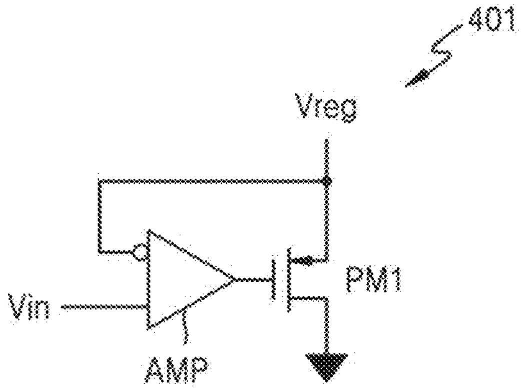
FIG. 12B illustrates a PMOS regulator according to an example embodiment.

FIG. 12B illustrates the PMOS regulator of FIG. 11, according to an example embodiment.

Referring to FIG. 12B, the PMOS-based regulator 401 according to an example embodiment may include an amplifier AMP and a transistor PM1. According to an example embodiment, the amplifier AMP may include an error amplifier. The transistor PM1 may include a p-type MOSFET. The PMOS-based regulator 401 may receive an input voltage Vin and output a regulator voltage Vreg having a voltage lower than the input voltage Vin. According to an example embodiment, the regulator voltage Vreg may have a magnitude of 400 [mV] or less. The PMOS-based regulator 401 may further include other configurations depending on the situation.

Figure 13:
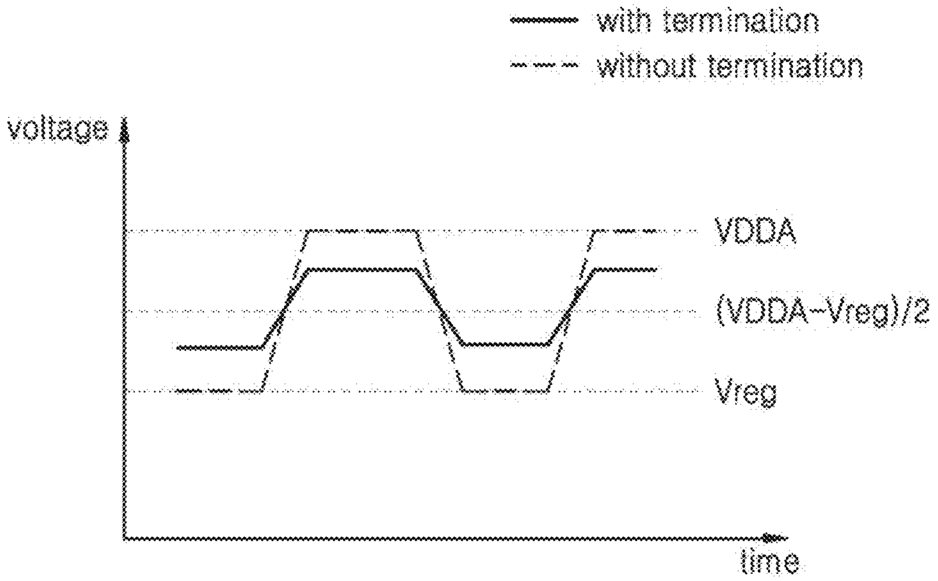
FIG. 13 illustrates a voltage graph applied to an NMOS-based input buffer according to an operation of a clock signal distribution circuit according to an example embodiment.

FIG. 13 shows a voltage graph applied to an NMOS-based input buffer according to an operation of the clock signal distribution circuit of FIG. 11.

FIG. 13 shows a voltage level according to time applied to the NMOS-based input buffer when there are no termination resistors in the termination block (without termination) and when there is a termination resistor in the termination block (with termination) in the case of an electronic device 20 including the PMOS-based regulator 401, the PMOS-based driver 402, and the NMOS-based input buffer 502_1.

If there are no termination resistors in the termination block (without termination), the waveform of the output signal of the PMOS-based driver 402 may correspond to the dashed line in FIG. 13. The common mode level may be (VDDA-Vreg)/2, and the voltage applied to the NMOS-based input buffer 502 may swing between the level of the regulator voltage Vreg and an analog supply voltage VDDA.

In the case that there are termination resistors in the termination block (with termination), the waveform of the output signal of the PMOS-based driver 402 may correspond to the solid line in FIG. 13. The common mode level may be Vreg/2, and a voltage applied to the NMOS-based input buffer 502 may swing between a level greater than a level of the regulator voltage Vreg and a level less than a voltage level of the analog supply voltage VDDA.

When the PMOS-based regulator 401 and the PMOS-based driver 402 transmit a low swing clock signal LS_CLK to the NMOS-based input buffer 502, the common mode level may be (VDDA-Vreg)/2. In addition, if termination resistors TMR1 and TMR2 are included in the terminal block TB (with termination), a VDD reference signaling is possible.

Figure 14:
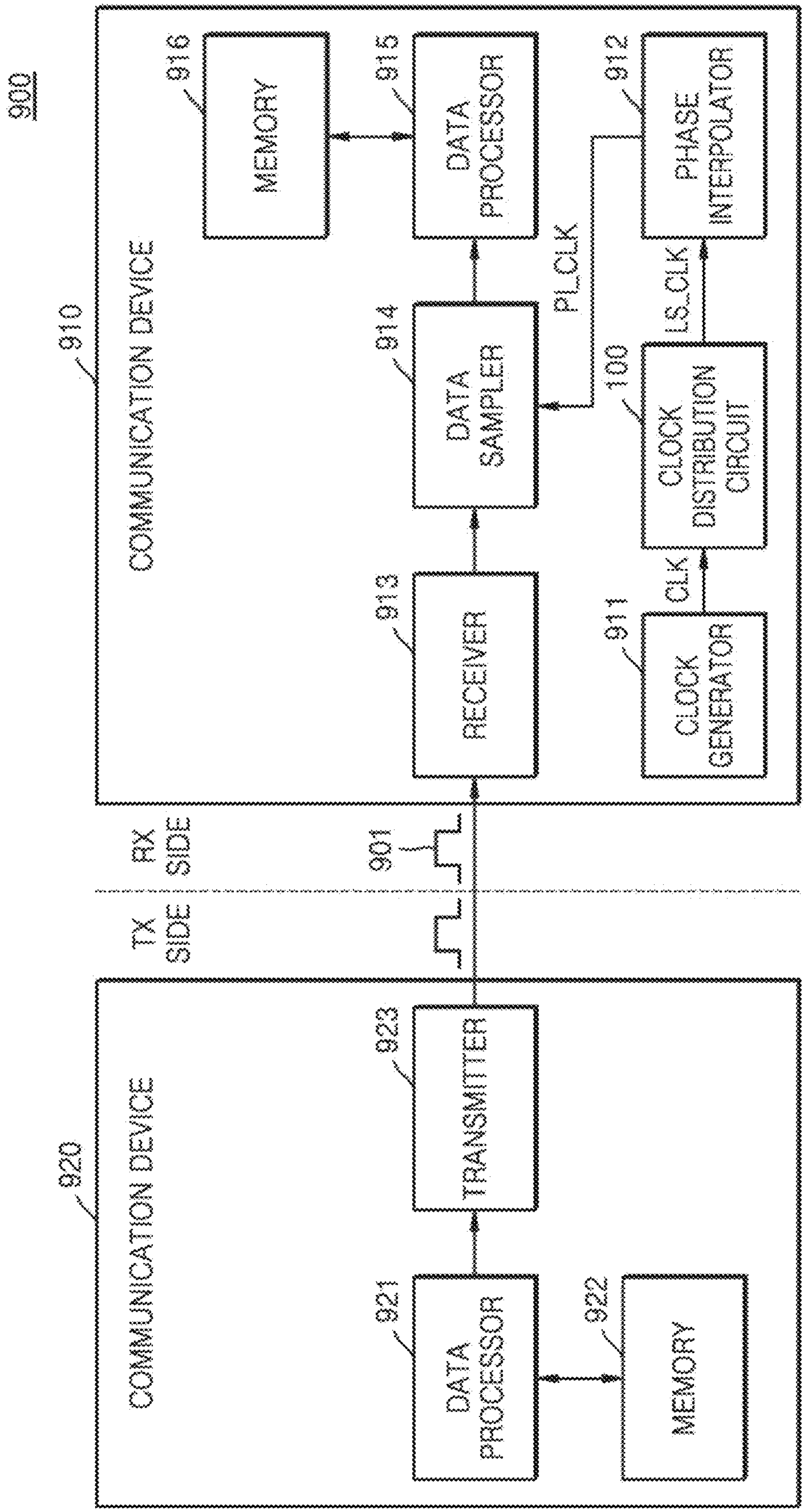
FIG. 14 is a block diagram illustrating a communication device and a communication system including the same according to example embodiments.

FIG. 14 is a block diagram illustrating first and second communication devices 910 and 920 and a communication system 900 including the same according to example embodiments.

FIG. 14 will be described with reference to FIG. 1. Referring to FIG. 14, the communication system 900 may include a communication channel 901, the first communication device 910, and the second communication device 920. The first communication device 910 and the second communication device 920 may perform communication operations with each other. For example, the first communication device 910 and the second communication device 920 may include processing devices including computers, network elements (e.g., routers, switches, etc.), portable communication devices, etc.

The first communication device 910 may include a phase interpolator 912 and a data sampler 914, and may further include a clock generator 911, a receiver 913, a data processor 915, and a memory 916. In addition, the first communication device 910 may include the clock signal distribution circuit 100 according to an example embodiment. For example, the phase interpolator 912 may include the PMOS-based input buffer 202 according to example embodiments. The second communication device 920 may include a data processor 921, a memory 922, and a transmitter 923. For example, the data processors 915 and 921 may be microprocessors or CPUs. For example, the memories 916 and 922 may include SRAMs, DRAMs, Synchronous DRAMs (SDRAMs), Double data rate SDRAMs (DDR SDRAMs), etc.

The data processor 921 of the second communication device 920 performs a data processing operation on data to be transmitted using the memory 922, and the transmitter 923 may output data on which the data processing operation has been performed in the form of a data stream through the communication channel 901.

The receiver 913 of the first communication device 910 may receive an input data stream and provide the input data stream to the data sampler 914. The clock generator 911 may generate a plurality of input clock signals CLK based on a crystal reference clock signal received from an external source. For example, the clock generator 911 may include a PLL circuit and/or a DLL circuit. The phase interpolator 912 may generate a phase interpolation clock signal PI_CLK based on a control signal CS (e.g., a phase interpolation code) and a plurality of low swing clock signals LS_CLK. The data sampler 914 may generate sample data by sampling an input data stream based on the phase interpolation clock signal PI_CLK. For example, the data sampler 914 may perform a data sampling operation multiple times to generate sample data. The data processor 915 may perform a data processing operation on the sample data using the memory 916.

Figure 15:
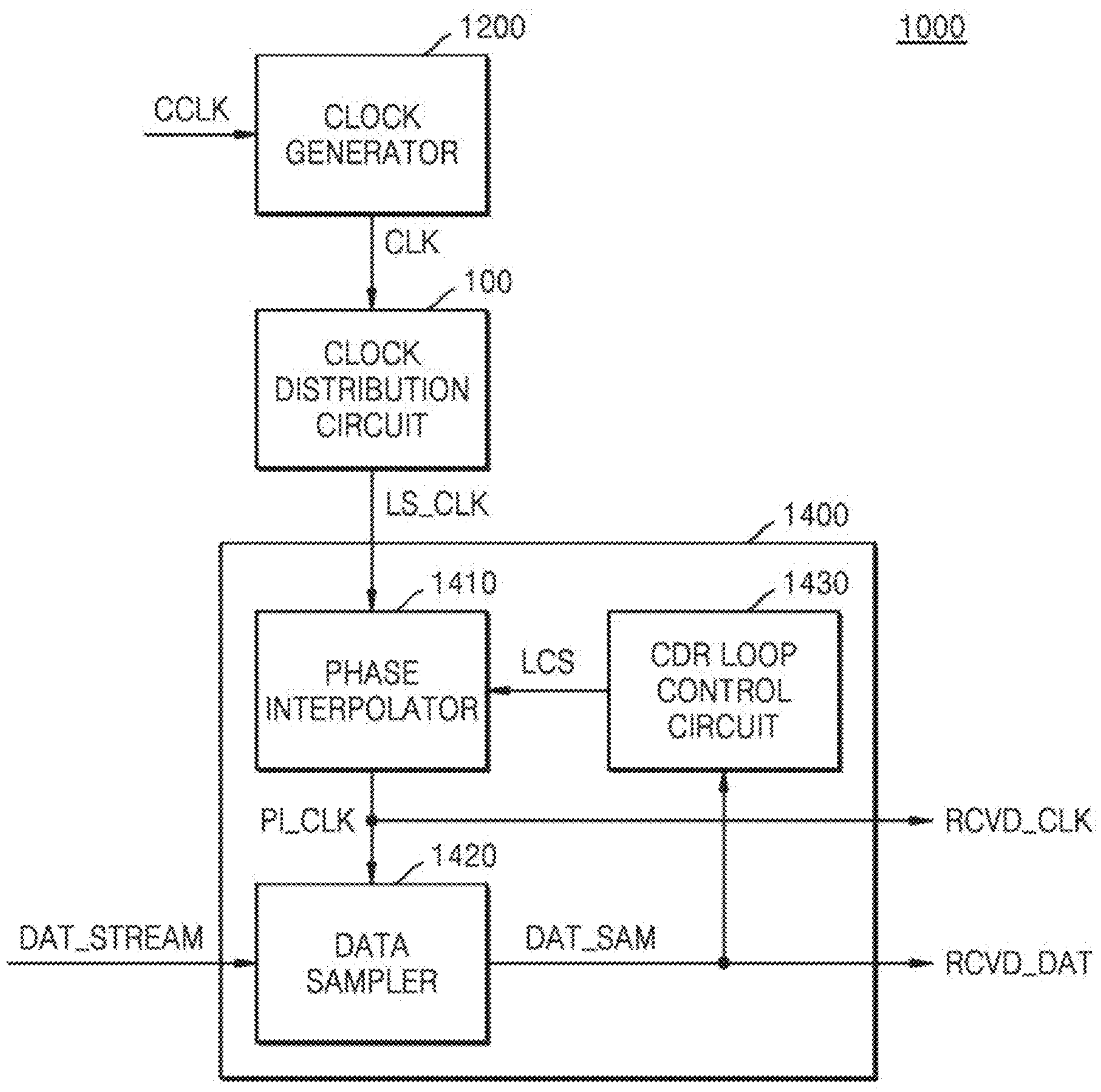
FIG. 15 is a block diagram illustrating a clock signal distribution circuit and a communication device including the same according to example embodiments.

FIG. 15 is a block diagram illustrating the clock signal distribution circuit 100 according to example embodiments and a communication device 1000 including the same.

Referring to FIG. 15, the communication device 1000 may include a clock generator 1200 and a clock data recovery device 1400. For example, the communication device 1000 may include a clock and data recovery (CDR) device. The clock data recovery device 1400 may be referred to as a CDR loop control circuit. The clock data recovery device 1400 may include a phase interpolator 1410, a data sampler 1420, and a clock data recovery loop controller 1430.

The clock generator 1200 may generate a plurality of input clock signals CLK based on a crystal reference clock signal CCLK received from an external source. For example, the clock generator 1200 may include a PLL circuit and/or a DLL circuit. The clock signal distribution circuit 100 according to an example embodiment may receive clock signals CLK and generate low swing clock signals LS_CLK. The phase interpolator 1410 may include the PMOS-based input buffer 202 according to example embodiments. The phase interpolator 1410 may generate a phase interpolation clock signal PI_CLK based on a loop control signal LCS (e.g., a phase interpolation code PI_CODE) received from the clock data recovery loop controller 1430 and a plurality of low swing clock signals LS_CLK. The data sampler 1420 may receive an input data stream DAT_STREAM from the outside and generate sample data DAT_SAM by performing a sampling operation based on the phase interpolation clock signal PI_CLK.

The clock data recovery loop controller 1430 may output a control signal (e.g., a loop control signal LCS) based on the sampling result of the data sampler 1420. The clock data recovery loop controller 1430 may generate a loop control signal LCS based on a performance result of a clock and data recovery operation. Specifically, the clock data recovery loop controller 1430 may determine whether the phase interpolation clock signal PI_CLK generated from the phase interpolator 1410 is located at the center of the sample data DAT_SAM using the 4-phase sample data DAT_SAM, and generate a loop control signal LCS based on the determination result. Through the CDR loop operation described above, the phase interpolator 1410 may generate a recovery clock signal RCVD_CLK and provide it to the data sampler 1420, and the data sampler 1420 may generate recovery data RCVD_DAT using the recovery clock signal RCVD_CLK. In this way, the clock data recovery device 1400 may generate the recovery clock signal RCVD_CLK and the recovery data RCVD_DAT and provide them to an external data processor. The clock data recovery loop controller 1430 may be referred to as a CDR loop control circuit.

Figure 16:
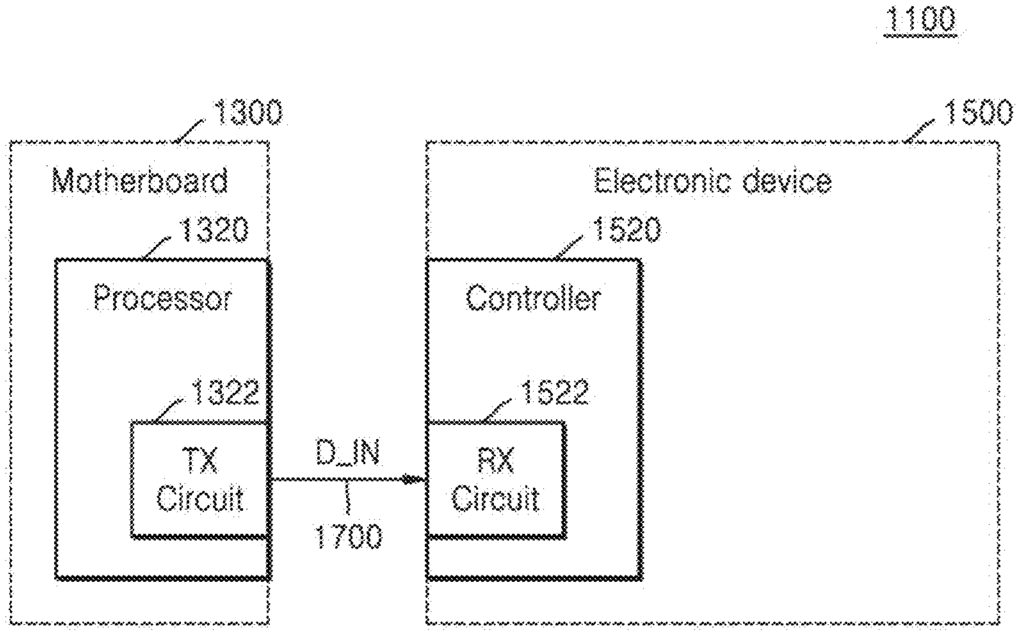
FIG. 16 is a block diagram illustrating a computing system according to example embodiments.

FIG. 16 is a block diagram illustrating a computing system 1100 according to example embodiments.

Referring to FIG. 16, the computing system 1100 may be, for non-limiting examples, a stationary system such as a desktop computer, a server, a TV, or an electronic board, or a mobile system such as a laptop computer, a mobile phone, a tablet PC, or a wearable device. The computing system 1100 may include a motherboard 1300 and an electronic device 1500, and input data D_IN may be transmitted from the motherboard 1300 to the electronic device 1500 via a data line 1700.

The motherboard 1300 may include a processor 1320, and the processor 1320 may include a transmitting circuit 1322. The clock data recovery circuit according to an example embodiment may be included in a receiving circuit 1522. The processor 1320 may refer to a processing unit that performs a computational operation, such as a microprocessor, a microcontroller, an application specific integrated circuit (ASIC), or a field programmable gate array (FPGA). The transmitting circuit 1322 may output input data D_IN to the receiving circuit 1522 for a clock data recovery operation of the receiving circuit 1522.

The electronic device 1500 may include a controller 1520. The controller 1520 may receive input data D_IN from the motherboard 1300 and perform a clock data recovery operation using the input data. The controller 1520 may include the receiving circuit 1522, and the receiving circuit 1522 may receive input data D_IN.

According to an example embodiment, the receiving circuit 1522 may include the clock signal distribution circuit 100 and the phase interpolator 201 of FIG. 1 according to example embodiments. The clock signal distribution circuit 100 included in the receiving circuit 1522 may be implemented as described above.

According to an example embodiment, the transmitting circuit 1322 may include the clock signal distribution circuit 100 and the phase interpolator 201 of FIG. 1 according to example embodiments. The clock signal distribution circuit 100 included in the transmitting circuit 1322 may be implemented as described above.

Figure 17:
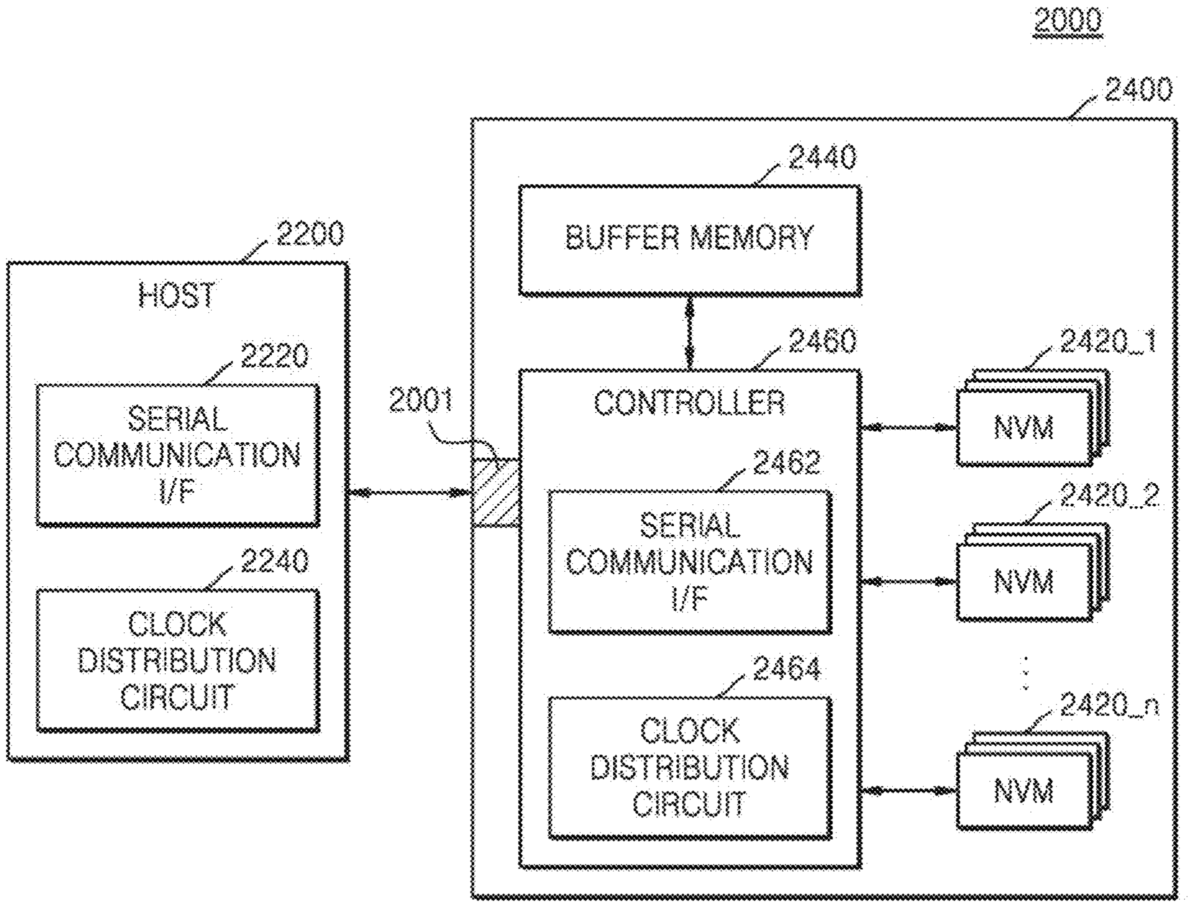
FIG. 17 is a block diagram illustrating a system including clock distribution circuits according to an example embodiment.

FIG. 17 is a block diagram illustrating a system 2000 including clock distribution circuits 2240 and 2464 according to an example embodiment.

FIG. 17 is a block diagram illustrating the system 2000 including the clock distribution circuits 2240 and 2464 (e.g., the clock signal distribution circuit 100 of FIG. 1) according to an example embodiment.

Referring to FIG. 17, the system 2000 may include a host 2200 and a storage device 2400. The storage device 2400 may be referred to as a memory system or a storage system and may include a signal connector 2001, a plurality of nonvolatile memories 2420_1 to **2420_*n*, a buffer memory 2440, and a controller 2460. For example, the controller 2460** may be referred to as a memory controller or a storage controller.

The storage device 2400 may transmit and receive signals with the host 2200 through the signal connector 2001. The host 2200 and the storage device 2400 may communicate through electrical signals and/or optical signals, and as non-limiting examples, may communicate through universal flash storage (UFS), serial advanced technology attachment (SATA), SATA express (SATAe), small computer small interface (SCSI), serial attached SCSI (SAS), peripheral component Interconnect express (PCIe), nonvolatile memory express (NVMe), advanced host controller interface (AHCI), or any combination thereof.

The controller 2460 may control the plurality of nonvolatile memories 2420_1 to **2420_*n* in response to signals received from the host 2200. The controller 2460 may include a serial communication interface circuit 2462 for transmitting and receiving data and may include the clock distribution circuit 2464 to which example embodiments are applied to distribute a clock of a received serial data signal. The serial communication interface circuit 2462 may provide a communication interface such as UFS, SATA, SATAe, SCSI, SAS, PCIe, NVMe, AHCI, etc. The buffer memory 2440 may operate as a buffer memory of the storage device 2400. The host 2200 may also include a serial communication interface circuit 2220 for data transmission and reception, and the clock distribution circuit 2240** to which example embodiments are applied.

Each of the nonvolatile memories 2420_1 to **2420_*n*** may include a memory cell array, the memory cell array may include memory blocks, each of the memory blocks may be divided into pages, and each of the pages may include nonvolatile memory cells, for example, at least one NAND flash memory cell.

While aspects of example embodiments have been particularly shown and described, it will be understood that various changes in form and details may be made therein without departing from the spirit and scope of the following claims.

What is claimed is:

1. A clock signal distribution circuit comprising:

an n-type metal-oxide semiconductor (NMOS)-based regulator configured to output a regulator voltage to a regulator voltage output node based on a first voltage, wherein the regulator voltage is lower than the first voltage; and an NMOS-based driver comprising a first sub-driver, wherein the first sub-driver comprises first to fourth NMOS transistors, and is configured to receive first and second clock signals, and output first and second low swing clock signals, wherein the first NMOS transistor is connected between the regulator voltage output node and a first output node, the second NMOS transistor is connected between the first output node and a ground node, a first clock signal is input to a gate terminal of the first NMOS transistor, a second clock signal is input to a gate terminal of the second NMOS transistor, and the first low swing clock signal is output through the first output node, wherein the third NMOS transistor is connected between the regulator voltage output node and a second output node, the fourth NMOS transistor is connected between the second output node and the ground node, the second clock signal is input to a gate terminal of the third NMOS transistor, the first clock signal is input to a gate terminal of the fourth NMOS transistor, and the second low swing clock signal is output through the second output node, and wherein the NMOS-based regulator includes a fifth NMOS transistor as a pass transistor.

2. The clock signal distribution circuit of claim 1, wherein the NMOS-based driver is further configured to receive the first clock signal and the second clock signal from a phased-locked loop (PLL) circuit, and wherein the first clock signal and the second clock signal have a phase difference of 180 degrees.

3. The clock signal distribution circuit of claim 1, wherein the NMOS-based driver comprises a first complementary metal oxide semiconductor (CMOS) buffer and a second CMOS buffer, wherein the first CMOS buffer is configured to receive the first clock signal from a phased-locked loop (PLL) circuit, and output the first clock signal to the gate terminal of the first NMOS transistor and the gate terminal of the fourth NMOS transistor, wherein the second CMOS buffer is configured to receive the second clock signal from the PLL circuit, and output the second clock signal to the gate terminal of the second NMOS transistor and the gate terminal of the third NMOS transistor, and wherein the first CMOS buffer and the second CMOS buffer are configured to receive an analog supply voltage.

4. The clock signal distribution circuit of claim 1, wherein a first variable resistor is connected between the first output node and a terminal node of the NMOS-based driver, wherein a second variable resistor is connected between the second output node and the terminal node of the NMOS-based driver, and wherein a capacitor is connected between the terminal node and the ground node.

5. The clock signal distribution circuit of claim 1, wherein the first sub-driver comprises an NMOS transistor array, and wherein the NMOS transistor array is connected at least one of between a drain terminal of the first NMOS transistor and the regulator voltage output node, between a source terminal of the second NMOS transistor and the ground node, between a drain terminal of the third NMOS transistor and the regulator voltage output node, and between a source terminal of the fourth NMOS transistor and the ground node.

6. The clock signal distribution circuit of claim 1, wherein the first sub-driver comprises one or more first output resistors, one or more second output resistors, one or more first switches, and one or more second switches, and wherein the first switch is connected to the first output node and to one end of the first output resistor, the second switch is connected to the second output node and to one end of the second output resistor, and the first switch and the second switch are configured to open and close based on a switch control signal.

7. The clock signal distribution circuit of claim 1, wherein the NMOS-based driver comprises a plurality of cell drivers, wherein each of the plurality of cell drivers comprises a cell switch and at least one of a plurality of first drivers, and wherein each of the plurality of cell drivers is configured to open and close based on a cell switch control signal.

8. The clock signal distribution circuit of claim 1, wherein the NMOS-based driver further comprises a second sub-driver, wherein the second sub-driver comprises sixth to ninth NMOS transistors, and is configured to receive third and fourth clock signals, and output third and fourth low swing clock signals, wherein the sixth NMOS transistor is connected between the regulator voltage output node and a third output node, the seventh NMOS transistor is connected between the third output node and the ground node, a third clock signal is input to a gate terminal of the sixth NMOS transistor, a fourth clock signal is input to a gate terminal of the seventh NMOS transistor, and a third low swing clock signal is output through the third output node, wherein the eighth NMOS transistor is connected between the regulator voltage output node and a fourth output node, the ninth NMOS transistor is connected between the fourth output node and the ground node, the fourth clock signal is input to a gate terminal of the eighth NMOS transistor, the third clock signal is input to a gate terminal of the ninth NMOS transistor, and a fourth low swing clock signal is output through the fourth output node, and wherein the third and fourth clock signals have a phase difference of 180 degrees from each other.

9. An electronic device comprising:

a clock signal distribution circuit comprising an n-type metal-oxide semiconductor (NMOS)-based regulator and an NMOS-based driver, wherein the NMOS-based regulator is configured to output a regulator voltage to a regulator voltage output node based on a first voltage, the regulator voltage is lower than the first voltage, and the NMOS-based driver comprises first to fourth NMOS transistors and a sub-driver configured to receive first and second clock signals and output first and second low swing clock signals; and a phase interpolator configured to receive the first low swing clock signal and the second low swing clock signal through a p-type metal-oxide semiconductor (PMOS)-based input buffer, wherein the first NMOS transistor is connected between the regulator voltage output node and a first output node, the second NMOS transistor is connected between the first output node and a ground node, a first clock signal is input to a gate terminal of the first NMOS transistor, a second clock signal is input to a gate terminal of the second NMOS transistor, and the first low swing clock signal is output through the first output node, wherein the third NMOS transistor is connected between the regulator voltage output node and a second output node, the fourth NMOS transistor is connected between the second output node and the ground node, the second clock signal is input to the gate terminal of the third NMOS transistor, the first clock signal is input to a gate terminal of the fourth NMOS transistor, and the second low swing clock signal is output through the second output node, and wherein the NMOS-based regulator comprises a fifth NMOS transistor as a pass transistor.

10. The electronic device of claim 9, further comprising a phased-locked loop (PLL) circuit, wherein the NMOS-based driver is further configured to receive the first clock signal and the second clock signal from the PLL circuit, and wherein the first clock signal and the second clock signal have a phase difference of 180 degrees.

11. The electronic device of claim 9, wherein the NMOS-based driver comprises a first complementary metal oxide semiconductor (CMOS) buffer and a second CMOS buffer, wherein the first CMOS buffer is configured to receive the first clock signal from a phased-locked loop (PLL) circuit, and output the first clock signal to the gate terminal of the first NMOS transistor and the gate terminal of the fourth NMOS transistor, wherein the second CMOS buffer is configured to receive the second clock signal from the PLL circuit, and output the second clock signal to the gate terminal of the second NMOS transistor and the gate terminal of the third NMOS transistor, and wherein the first CMOS buffer and the second CMOS buffer are configured to receive an analog supply voltage.

12. The electronic device of claim 9, further comprising:

a first variable resistor connected between the first output node and a terminal node of the NMOS-based driver;

a second variable resistor connected between the second output node and the terminal node; and a capacitor connected between the terminal node and the ground node.

13. The electronic device of claim 9, wherein the sub-driver comprises an NMOS transistor array, and wherein the NMOS transistor array is connected between a drain terminal of the first NMOS transistor and the regulator voltage output node, between a source terminal of the second NMOS transistor and the ground node, between a drain terminal of the third NMOS transistor and the regulator voltage output node, or between a source terminal of the fourth NMOS transistor and the ground node.

14. The electronic device of claim 9, wherein the sub-driver comprises one or more first output resistors, one or more second output resistors, one or more first switches, and one or more second switches, and wherein the first switch is connected to the first output node and to one end of the first output resistor, the second switch is connected to the second output node and to one end of the second output resistor, and the first switch and the second switch are configured to open and close based on a switch control signal.

15. The electronic device of claim 9, wherein the NMOS-based driver comprises a plurality of cell drivers, wherein each of the plurality of cell drivers comprises a cell switch and at least one of the first sub-drivers, and wherein the cell switch of each of the plurality of cell drivers is configured to open and close based on a cell switch control signal.

16. The electronic device of claim 9, wherein the NMOS-based driver further comprises a second sub-driver, wherein the second sub-driver comprises sixth to ninth NMOS transistors, and is configured to receive third and fourth clock signals, and output third and fourth low swing clock signals, wherein the sixth NMOS transistor is connected between the regulator voltage output node and a third output node, the seventh NMOS transistor is connected between the third output node and the ground node, a third clock signal is input to a gate terminal of the sixth NMOS transistor, a fourth clock signal is input to a gate terminal of the seventh NMOS transistor, and a third low swing clock signal is output through the third output node, wherein the eighth NMOS transistor is connected between the regulator voltage output node and a fourth output node, the ninth NMOS transistor is connected between the fourth output node and the ground node, the fourth clock signal is input to a gate terminal of the eighth NMOS transistor, the third clock signal is input to a gate terminal of the ninth NMOS transistor, and a fourth low swing clock signal is output through the fourth output node, and wherein the third and fourth clock signals have a phase difference of 180 degrees from each other.

17. The electronic device of claim 9, wherein the PMOS-based input buffer comprises a first PMOS transistor connected between a current source and a first voltage output node, a second PMOS transistor connected between the current source and a second voltage output node, a third variable resistor connected between the first voltage output node and the ground node, and a fourth variable resistor connected between the second voltage output node and the ground node, and wherein the first low swing clock signal is input to a gate terminal of the first PMOS transistor, and the second low swing clock signal is input to a gate terminal of the second PMOS transistor.

18. A clock signal distribution circuit comprising:

a p-type metal-oxide semiconductor (PMOS)-based regulator configured to output a regulator voltage to a regulator voltage output node based on a first voltage, wherein the regulator voltage is lower than the first voltage; and a PMOS-based driver comprising a first sub-driver, wherein the first sub-driver comprises first to fourth PMOS transistors, and is configured to receive first and second clock signals and output first and second low swing clock signals, wherein the first PMOS transistor is connected between a supply voltage input node and a first output node, the second PMOS transistor is connected between the first output node and the regulator voltage output node, a first clock signal is input to a gate terminal of the first PMOS transistor, a second clock signal is input to a gate terminal of the second PMOS transistor, and the first low swing clock signal is output through the first output node, wherein the third PMOS transistor is connected between the supply voltage input node and a second output node, the fourth PMOS transistor is connected between the second output node and the regulator voltage output node, the second clock signal is input to a gate terminal of the third PMOS transistor, the first clock signal is input to the gate terminal of the fourth PMOS transistor, and the second low swing clock signal is output through the second output node, and wherein the PMOS-based regulator comprises a fifth PMOS transistor as a pass transistor.

19. The clock signal distribution circuit of claim 18, wherein the PMOS-based driver is further configured to receive the first clock signal and the second clock signal from a phased-locked loop (PLL) circuit, and wherein the first clock signal and the second clock signal have a phase difference of 180 degrees.

20. The clock signal distribution circuit of claim 18, wherein the PMOS-based driver comprises a first complementary metal oxide semiconductor (CMOS) buffer and a second CMOS buffer, wherein the first CMOS buffer is configured to receive the first clock signal from the PLL circuit and output the first clock signal to the gate terminals of the first PMOS transistor and the fourth PMOS transistor, wherein the second CMOS buffer is configured to receive the second clock signal from the PLL circuit and output the second clock signal to the gate terminals of the second PMOS transistor and the third PMOS transistor, and wherein the first CMOS buffer and the second CMOS buffer are configured to receive an analog supply voltage.

* * * * *